(12) United States Patent
Kobayashi et al.

(10) Patent No.: US 10,566,440 B2
(45) Date of Patent: Feb. 18, 2020

(54) PRODUCTION METHOD FOR SEMICONDUCTOR DEVICE

(71) Applicant: FUJI ELECTRIC CO., LTD., Kawasaki-shi, Kanagawa (JP)

(72) Inventors: Yusuke Kobayashi, Matsumoto (JP); Takashi Yoshimura, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/936,048

(22) Filed: Mar. 26, 2018

(65) Prior Publication Data
US 2018/0226486 A1 Aug. 9, 2018

Related U.S. Application Data

(63) Continuation of application No. 14/372,450, filed as application No. PCT/JP2013/057736 on Mar. 18, 2013, now Pat. No. 9,947,761.

(30) Foreign Application Priority Data

Mar. 19, 2012 (JP) .................................. 2012-062751

(51) Int. Cl.
| | |
|---|---|
| H01L 29/66 | (2006.01) |
| H01L 21/265 | (2006.01) |
| H01L 29/32 | (2006.01) |
| H01L 29/36 | (2006.01) |
| H01L 29/861 | (2006.01) |
| H01L 29/739 | (2006.01) |
| H01L 21/263 | (2006.01) |

(Continued)

(52) U.S. Cl.
CPC ...... *H01L 29/66333* (2013.01); *H01L 21/263* (2013.01); *H01L 21/265* (2013.01);
(Continued)

(58) Field of Classification Search
None
See application file for complete search history.

(56) References Cited

U.S. PATENT DOCUMENTS 6,165,876 A * 12/2000 Yamazaki ........... H01L 21/2026
                                                          438/517
2002/0190281 A1 12/2002 Francis et al.
(Continued)

FOREIGN PATENT DOCUMENTS

| DE | 10240107 A1 | 3/2004 |
|---|---|---|
| JP | H04-27706 B2 | 5/1992 |

(Continued)

OTHER PUBLICATIONS

Extended European Search Report dated Sep. 22, 2015.
Chinese Office Action dated Dec. 28, 2015 in the corresponding Chinese Patent Application with English translation.

*Primary Examiner* — Charles D Garber
*Assistant Examiner* — Steven M Christopher
(74) *Attorney, Agent, or Firm* — Rabin & Berdo, P.C.

(57) ABSTRACT

A method for producing a semiconductor device includes implanting protons from a rear surface of a semiconductor substrate of a first conductivity type, and after the implanting protons, forming a first semiconductor region of the first conductivity type having a impurity concentration higher than that of the semiconductor substrate by performing an annealing process for the semiconductor substrate in an annealing furnace. The forming a first semiconductor region includes substituting oxygen gas for nitrogen gas in a normal pressure atmosphere, thereby reducing a partial pressure of the oxygen in the annealing furnace, and after the subtracting oxygen gas, performing the annealing process in the annealing furnace with a hydrogen gas atmosphere in a range of 300° C. to 450° C. The hydrogen gas atmosphere includes a volume concentration of hydrogen in a range of 6% to 30%.

19 Claims, 23 Drawing Sheets

(51) Int. Cl.
  *H01L 21/304* (2006.01)
  *H01L 21/324* (2006.01)
  *H01L 29/10* (2006.01)
  *H01L 29/40* (2006.01)
  *H01L 29/06* (2006.01)

(52) U.S. Cl.
  CPC ...... *H01L 21/26506* (2013.01); *H01L 21/304* (2013.01); *H01L 21/324* (2013.01); *H01L 29/1095* (2013.01); *H01L 29/32* (2013.01); *H01L 29/36* (2013.01); *H01L 29/66128* (2013.01); *H01L 29/66348* (2013.01); *H01L 29/7397* (2013.01); *H01L 29/8611* (2013.01); *H01L 29/0619* (2013.01); *H01L 29/402* (2013.01)

(56) References Cited

U.S. PATENT DOCUMENTS

| | | |
|---|---|---|
| 2003/0219948 A1 | 11/2003 | Kuribayashi |
| 2006/0081923 A1 | 4/2006 | Mauder et al. |
| 2006/0286753 A1 | 12/2006 | Barthelmess et al. |
| 2008/0122001 A1 | 5/2008 | Pfirsch et al. |
| 2008/0315364 A1 | 12/2008 | Nemoto |
| 2010/0006860 A1* | 1/2010 | Roedle ............ H01L 29/66068 257/77 |
| 2011/0003460 A1 | 1/2011 | Akiyama et al. |
| 2012/0267681 A1 | 10/2012 | Nemoto et al. |

FOREIGN PATENT DOCUMENTS

| | | | |
|---|---|---|---|
| JP | H09-260639 A | | 10/1997 |
| JP | 2004-006660 A | | 1/2004 |
| JP | 2008-091853 A | | 4/2008 |
| JP | 2008-211148 A | | 9/2008 |
| JP | 2009-099705 A | | 5/2009 |
| JP | 2011-230070 A | | 11/2011 |
| JP | 2011230070 A | * | 11/2011 |
| WO | WO-01-86712 A1 | | 11/2001 |
| WO | WO-2007/055352 A1 | | 5/2007 |
| WO | WO-2011/052787 A1 | | 5/2011 |
| WO | WO-2011052787 A1 | * | 5/2011 ........... H01L 21/263 |

* cited by examiner

| RATED VOLTAGE (V) | BREAKDOWN VOLTAGE (V) | TOTAL THICKNESS OF SUBSTRATE $W_0$ (μm) | SPECIFIC RESISTANCE (Ωcm) | AVERAGE CONCENTRATION OF DRIFT LAYER (/cm³) | RATED CURRENT DENSITY (A/cm²) | DISTANCE INDEX L (μm) | FS LAYER WHICH DEPLETION LAYER END REACHES FIRST : DISTANCE FROM REAR SURFACE (μm) |||||||||||
|---|---|---|---|---|---|---|---|---|---|---|---|---|---|---|---|---|
| | | | | | | | $W_0$−0.7L | $W_0$−0.8L | $W_0$−0.9L | $W_0$−1.0L | $W_0$−1.1L | $W_0$−1.2L | $W_0$−1.3L | $W_0$−1.4L | $W_0$−1.5L | $W_0$−1.6L |
| 600 | 700 | 60 | 30 | $1.5 \times 10^{14}$ | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | $7.7 \times 10^{13}$ | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | $5.4 \times 10^{13}$ | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | $2.8 \times 10^{13}$ | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | $2.0 \times 10^{13}$ | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | $1.4 \times 10^{13}$ | 30 | 337.3 | 413.9 | 380.1 | 346.4 | 312.7 | 278.9 | 245.2 | 211.5 | 177.7 | 144.0 | 110.3 |

FIG. 17

PRODUCTION METHOD FOR SEMICONDUCTOR DEVICE

This application is a continuation of U.S. application Ser. No. 14/372,450, filed on Jul. 16, 2014, and allowed on Dec. 6, 2017, which is a national stage of International Application PCT/JP2013/057736 having the International Filing Date of Mar. 18, 2013, and having the benefit of the earlier filing date of Japanese Application No. 2012-062751, filed on Mar. 19, 2012. Each of the identified U.S. and foreign applications is fully incorporated herein by reference.

TECHNICAL FIELD

The present invention relates to a method for producing a semiconductor device.

BACKGROUND ART

As a power semiconductor device, for example, there is a diode or an insulated gate bipolar transistor (IGBT) with a breakdown voltage of 400 V, 600 V, 1200 V, 1700 V, 3300 V, or more. The power semiconductor device is used in a power conversion device, such as a converter or an inverter. The power semiconductor device requires characteristics, such as low loss, high efficiency, a high breakdown voltage, and low costs.

FIG. 12 is a cross-sectional view illustrating a diode according to the related art. A p-type anode layer 1501 is formed on a main surface of an n⁻ semiconductor substrate 1500 and an n⁺ cathode layer 1502 is formed on an opposite surface. A p-type layer which will be a termination region 1503 is formed in the outer circumference of the p-type anode layer 1501. An anode electrode 1505 is formed on the p-type anode layer 1501 and a cathode electrode 1506 is formed on a power surface of the n⁺ cathode layer 1502. Reference numeral 1507 is a field plate and reference numeral 1508 is an insulating layer.

In an element, such as the diode, in order to reduce voltage oscillation which causes noise during switching, doping concentration control is required at a deep position of the n⁻ semiconductor substrate 1500 from the front surface to the rear surface.

As a carrier concentration control method, a method has been known which generates a donor using proton implantation in which a deep range is obtained in silicon at a relatively low acceleration voltage. This method performs proton implantation for a region including a predetermined concentration of oxygen to form an n-type region. It has been known that crystal defects are generated in the silicon substrate by the proton implantation. The crystal defect is inevitable in the generation of donors and causes deterioration of electric characteristics which cause an increase in leakage current, depending on, for example, the kind or concentration of defects.

A large number of defects which are introduced by proton implantation remain in the range (stopping range) Rp of a proton (the distance of a position where the concentration of ions implemented by ion implantation is the highest from an implantation surface), in a proton passage region which extends from the implantation surface to the range, and in the vicinity of the implantation surface. The remaining defect is in a state close to an amorphous state since the deviation of atoms (in this case, silicon atoms) from a lattice location is large and the disorder of a crystal lattice is strong. Therefore, the remaining defect deteriorates the characteristics of the element. For example, the remaining defect becomes the scattering center of carriers, such as electrons and holes, reduce carrier mobility, and increases electric resistance. In addition, the remaining defect becomes the generation center of carriers and increases the amount of leakage current. As such, the defect which remains in the proton passage region from the implantation surface to the range of the proton by proton implantation, causes a reduction in carrier mobility and an increase in leakage current, and is strongly disturbed from a crystal state is particularly referred to as a disorder.

The disorder reduces carrier mobility and causes deterioration of characteristics, such as an increase in leakage current or conduction loss. Therefore, an appropriate crystal defect control technique is required which generates donors while suppressing an increase in leakage current.

A method of generating donors using proton implantation has been known in which one of the main donor generation factors is the substitution of hydrogen which is introduced into silicon with oxygen in a VO defect, which is a combination of a silicon vacancy and an oxygen atom, by a heat treatment and the generation of donors is accelerated by an oxygen cluster.

In the generation of the donors by proton implantation, it is effective to increase the amount of hydrogen introduced into silicon in order to increase the number of donors generated. However, when a proton dose increases, the number of crystal defects increases. In addition, when the crystal defect is recovered by a high-temperature heat treatment, the donor is vanished by the proton. Therefore, it is difficult to increase the number of donors generated due to the trade-off relationship. In order to overcome the trade-off characteristics, a method which introduces hydrogen into silicon needs to be combined with the proton implantation or the crystal defect needs to be recovered by a method other than the high-temperature heat treatment.

For example, the following techniques have been known: a technique related to a proton dose and an annealing temperature for the generation of donor by proton implantation (for example, see the following Patent Document 1); a technique in which heat treatment conditions are described for a method of generating donors using proton implantation (for example, see the following Patent Document 2); and a technique in which the depth of a region which is formed by the method of generating donors using proton implantation from an implantation surface is described (for example, see the following Patent Document 3).

The technique disclosed in Patent Document 1 forms a main junction in a silicon thyristor pellet, locally implants proton ions in a peripheral portion, performs a low-temperature heat treatment to locally change protons into donors, and forms a low-resistance channel stop layer. In addition, the technique forms the channel stop layer in a crystal of the crystal which is difficult to pattern, with a simple process.

The technique disclosed in Patent Document 2 relates to a method which forms a blocking zone in a semiconductor substrate. The method includes a step of preparing a semiconductor substrate which includes first and second surfaces and is doped with a first-conductivity-type base material, a step of implanting a proton into one of the first and second surfaces of the semiconductor substrate such that the proton is introduced into a first region of the semiconductor substrate which is separated from an implantation surface, and a step of performing a heat treatment which heats the semiconductor substrate for a predetermined period of time at a predetermined temperature to generate a hydrogen induced donor in both the first region and a second region which is adjacent to the first region on the implantation surface.

The technique disclosed in Patent Document 3 forms a plurality of blocking zones using proton implantation into a semiconductor substrate such that the deepest blocking zone is formed at a depth of 15 μm from an implantation surface.

CITATION LIST

Patent Document

Patent Document 1: JP 9-260639 A
Patent Document 2: US 2006-0286753 A
Patent Document 3: US 2006-0081923 A However, Patent Document 1 does not disclose the detailed description of annealing in a hydrogen atmosphere. Patent Document 2 does not disclose a method of increasing a donor generation rate. In order to increase the donor generation rate using proton implantation, it is necessary to introduce a large amount of hydrogen into silicon. When the proton dose increases, the number of crystal defects increases, which results in deterioration of characteristics. In addition, when the crystal defect is recovered by the high-temperature heat treatment, the donor is vanished. As such, in the generation of the donors by proton implantation, it is possible to reduce the crystal defects and to increase the rate of change into a donor.

The inventors' examination result proved that, when the range (stopping range) of proton implantation (the distance of a position where the concentration of ions implanted by ion implantation was the highest from the implantation surface) was greater than 15 μm as in Patent Document 3, disorder was not sufficiently reduced in the vicinity of the proton implantation surface and in the proton passage region. FIGS. 13A-13C are characteristic diagrams illustrating the comparison between carrier concentration distributions in each range when the range Rp of proton implantation is about 15 μm and is greater than 15 μm. FIG. 13A illustrates a case in which the range Rp is 50 μm, FIG. 13B illustrates a case in which the range Rp is 20 μm, and FIG. 13C illustrates a case in which the range Rp is 15 μm.

When the range Rp is 15 μm as illustrated in FIG. 13C, a carrier concentration in the vicinity of the proton implantation surface (the depth is 0 μm to 5 μm) and in the proton passage region is higher than the impurity concentration, $1 \times 10^{14}$ (/cm$^3$), of the silicon substrate and the disorder is sufficiently reduced. In contrast, when range Rp is 20 μm as illustrated in FIG. 13B and when the range Rp is 50 μm as illustrated in FIG. 13A, carrier concentration in the vicinity of the proton implantation surface and in the proton passage region is greatly reduced and the disorder is not reduced. As such, when the disorder remains, the leakage current or conduction loss of the element increases. Therefore, when the range Rp of proton implantation is greater than 15 μm, a new method for reducing the disorder needs to be examined.

The invention has been made in view of the above-mentioned problems of the related art and an object of the invention is to reduce crystal defects in the generation of donors by proton implantation. In addition, an object of the invention is to improve the rate of change into a donor in the generation of donors by proton implantation.

SUMMARY

In order to solve the above-mentioned problems and achieve the objects of the invention, a method for producing a semiconductor device according to the invention has the following characteristics. First, an implantation step of performing proton implantation from a rear surface of a semiconductor substrate of a first conductivity type is performed. After the implantation step, a formation step of performing an annealing process for the semiconductor substrate in an annealing furnace to form a first semiconductor region of a first conductivity type which has a higher impurity concentration than the semiconductor substrate is performed. The annealing furnace includes an explosion protection means for preventing explosion due to hydrogen gas. In the formation step, the annealing furnace is in a hydrogen atmosphere and volume concentration of hydrogen is in a range of 6% to 30%.

In the method for producing a semiconductor device according to the invention, the semiconductor device may be a diode, the first semiconductor region of the first conductivity type may be an n-type field stop layer, and the semiconductor substrate may be a cathode layer.

In the method for producing a semiconductor device according to the invention, the semiconductor device may be an insulated gate bipolar transistor, the first semiconductor region of the first conductivity type may be an n-type field stop layer, and the semiconductor substrate may be a drift layer.

In the method for producing a semiconductor device according to the invention, the volume concentration of the hydrogen may be set such that a donor generation rate increases, without any saturation, and carrier concentration of a region from a drift region of the semiconductor substrate to a cathode electrode increases.

In the method for producing a semiconductor device according to the invention, the volume concentration of the hydrogen may be set such that a donor generation rate increases, without any saturation, and carrier concentration of a region from the drift layer of the semiconductor substrate to a collector electrode increases.

In the method for producing a semiconductor device according to the invention, an annealing temperature of the annealing process may be in the range of 300° C. to 450° C.

In the method for producing a semiconductor device according to the invention, an annealing temperature of the annealing process may be in the range of 330° C. to 380° C.

In the method for producing a semiconductor device according to the invention, a processing time of the annealing process may be in the range of 1 hour to 10 hours.

In the method for producing a semiconductor device according to the invention, the processing time of the annealing process may be in the range of 3 hours to 7 hours.

In the method for producing a semiconductor device according to the invention, the processing time of the annealing process may be 5 hours or more.

In the method for producing a semiconductor device according to the invention, a proton dose in the proton implantation may be in the range of $3 \times 10^{12}$/cm$^2$ to $5 \times 10^{14}$/cm$^2$.

In the method for producing a semiconductor device according to the invention, a proton dose in the proton implantation may be in the range of $1 \times 10^{13}$/cm$^2$ to $1 \times 10^{14}$/cm$^2$.

In the method for producing a semiconductor device according to the invention, the partial pressure of oxygen in the annealing furnace may be reduced by the explosion protection means.

In the method for producing a semiconductor device according to the invention, when a logarithm log(E) of implantation energy E of a proton in the proton implantation is y and a logarithm log(Rp) of a range Rp of the proton is x, $y=-0.0047x^4+0.0528x^3-0.2211x^2+0.9923x+5.0474$ may be satisfied.

According to the invention, when annealing is performed in a hydrogen atmosphere in which hydrogen concentration is in a range of 6% to 30% after proton implantation, it is possible to introduce hydrogen into silicon using a method other than proton implantation. It is possible to recover the crystal defect in a proton passage region and to prevent a reduction in the carrier concentration of the region from the n-type field stop layer to the cathode electrode.

According to the method for producing a semiconductor device of the invention, in the generation of donors by proton implantation, it is possible to introduce hydrogen into the silicon substrate, without increasing the crystal defects, and to prevent deterioration of characteristics due to the crystal defects. In addition, according to the method for producing a semiconductor device of the invention, it is possible to improve the donor generation rate in the generation of donors by proton implantation.

BRIEF DESCRIPTION OF THE DRAWINGS

FIG. 17 is a diagram illustrating the position conditions of a field stop layer which a depletion layer reaches first in the semiconductor device according to the invention;

DETAILED DESCRIPTION

Figure 1:
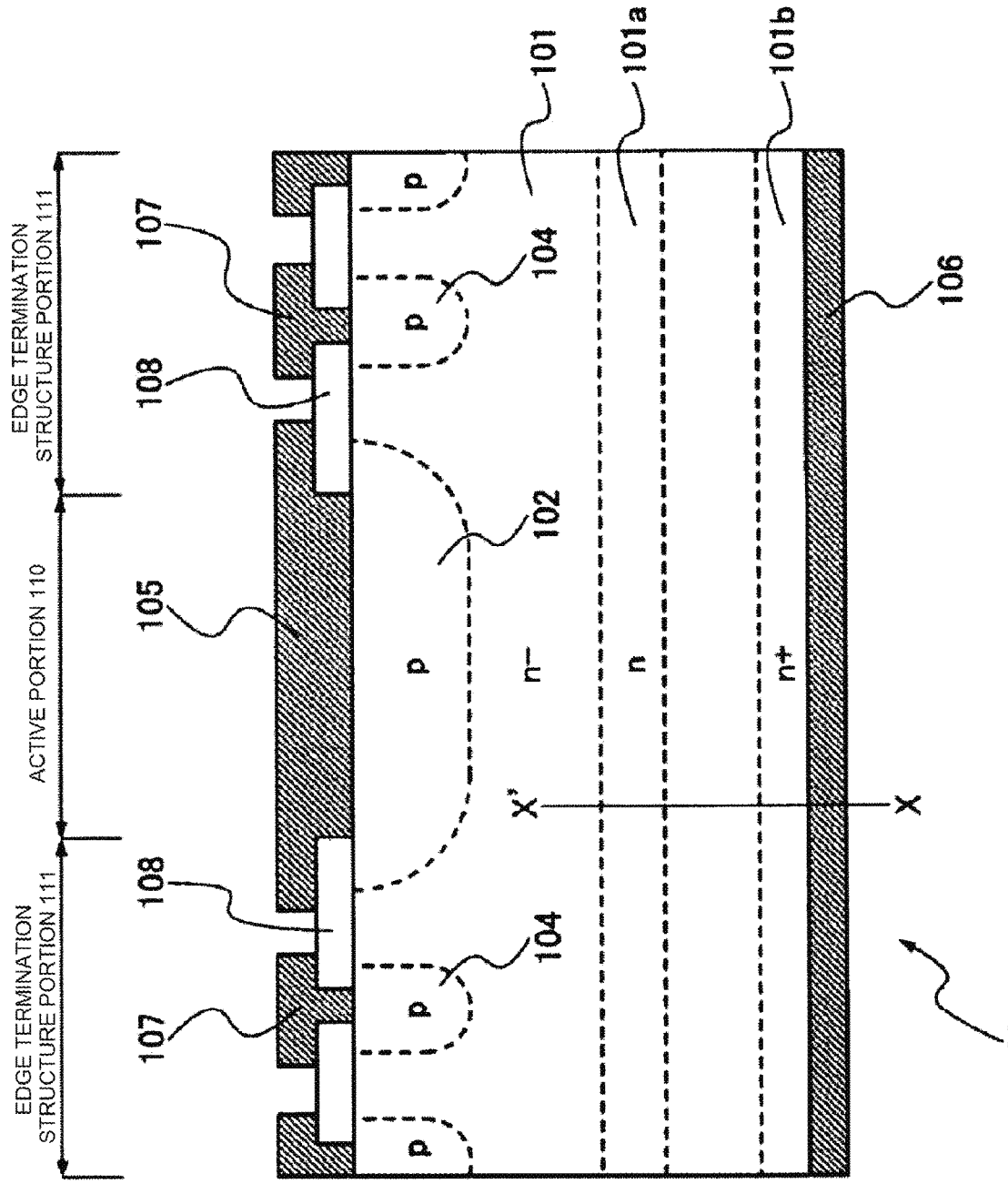
FIG. 1 is a cross-sectional view illustrating a diode as a semiconductor device according to the invention.

Hereinafter, preferred embodiments of a method for producing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

First Embodiment

FIG. 1 is a cross-sectional view illustrating a diode as a semiconductor device according to the invention. An example of a semiconductor device 100 illustrated in FIG. 1 is a diode. However, the semiconductor device 100 may be an insulated gate bipolar transistor (IGBT).

In the semiconductor device 100, a p-type anode layer 102 is formed in a surface layer of a main surface of an n⁻ semiconductor substrate (n⁻ drift region) 101 and an n⁺ cathode layer 101b is formed in a surface layer of an opposite surface (rear surface). A p-type layer, which will be a termination region 104, is formed in the outer circumference of the p-type anode layer 102. The semiconductor device 100 controls the doping concentration of n-type impurities at a deep position from the front surface to the rear surface in order to reduce voltage oscillation which causes noise during switching.

FIG. 1 illustrates a state in which, after proton implantation, annealing is performed in a hydrogen atmosphere to accelerate the generation of donors, which are protons. For carrier concentration control, an n layer 101a is formed using proton implantation in which a deep range is obtained in silicon at a relatively low acceleration voltage. The n layer 101a becomes a field stop (FS) layer by proton implantation and has a higher impurity concentration than an n$^-$ drift region (n$^-$ semiconductor substrate 101).

An anode electrode 105 is provided on the p-type anode layer 102 and a cathode electrode 106 is formed on a lower surface (the rear surface of the semiconductor device 100) of the n$^+$ cathode layer 101b. In addition, the active portion 110 is a region in which a current flows when the semiconductor device is turned on. An edge termination structure portion 111 is a region which reduces the electric field of the main surface of the n$^-$ semiconductor substrate (n$^-$ drift region) 101 and holds a breakdown voltage.

For example, a field limiting ring (FLR: a termination region) 104, which is a p-type floating region, and a field plate (FP) 107, which is a conductive film electrically connected to the termination region 104, are provided in the edge termination structure portion 111. Reference numeral 108 indicates an insulating layer.

Figure 2:
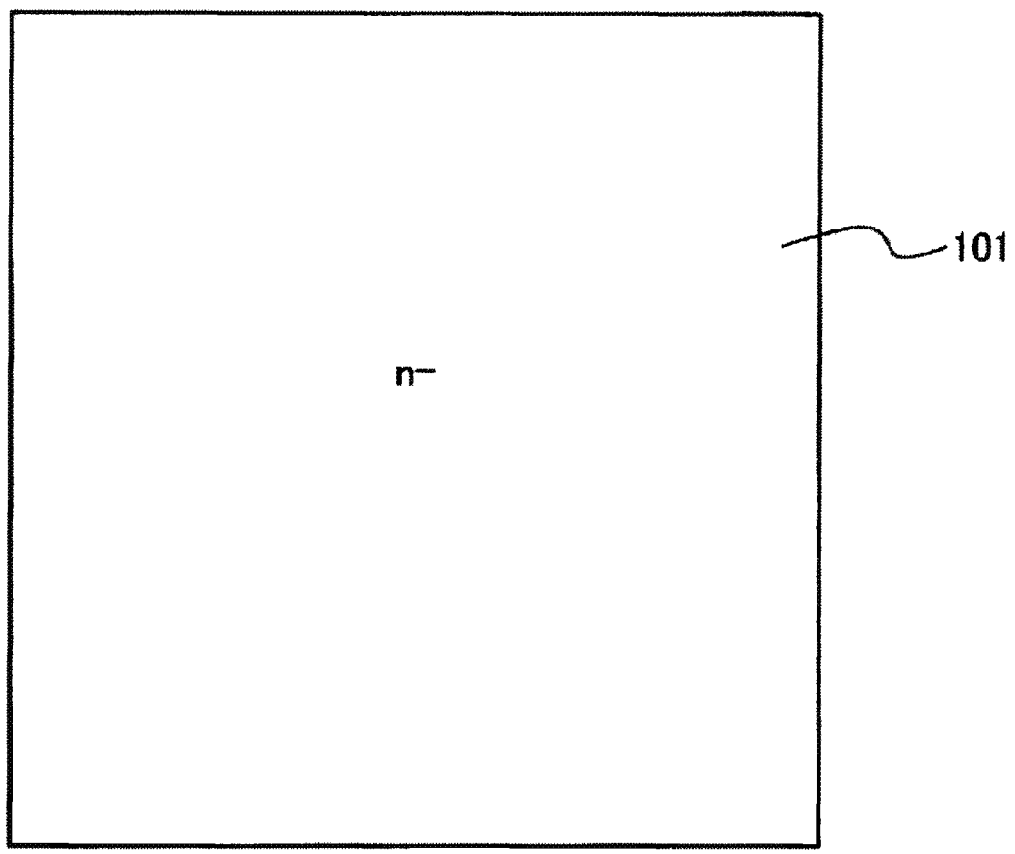
FIG. 2 is a cross-sectional view (part 1) illustrating a process of producing an active portion of the diode according to the invention.

FIGS. 2 to 8 are cross-sectional views illustrating a process of producing the active portion of the diode according to the invention. The structure of the active portion 110 will be described with reference to FIGS. 2 to 8. First, as illustrated in FIG. 2, a heat treatment is performed for the n$^-$ semiconductor substrate 101, which will be the n$^-$ drift region, in a water-vapor atmosphere to form an initial oxide film. Then, the oxide film is removed only in the active portion region by photolithography and wet etching.

Figure 3:
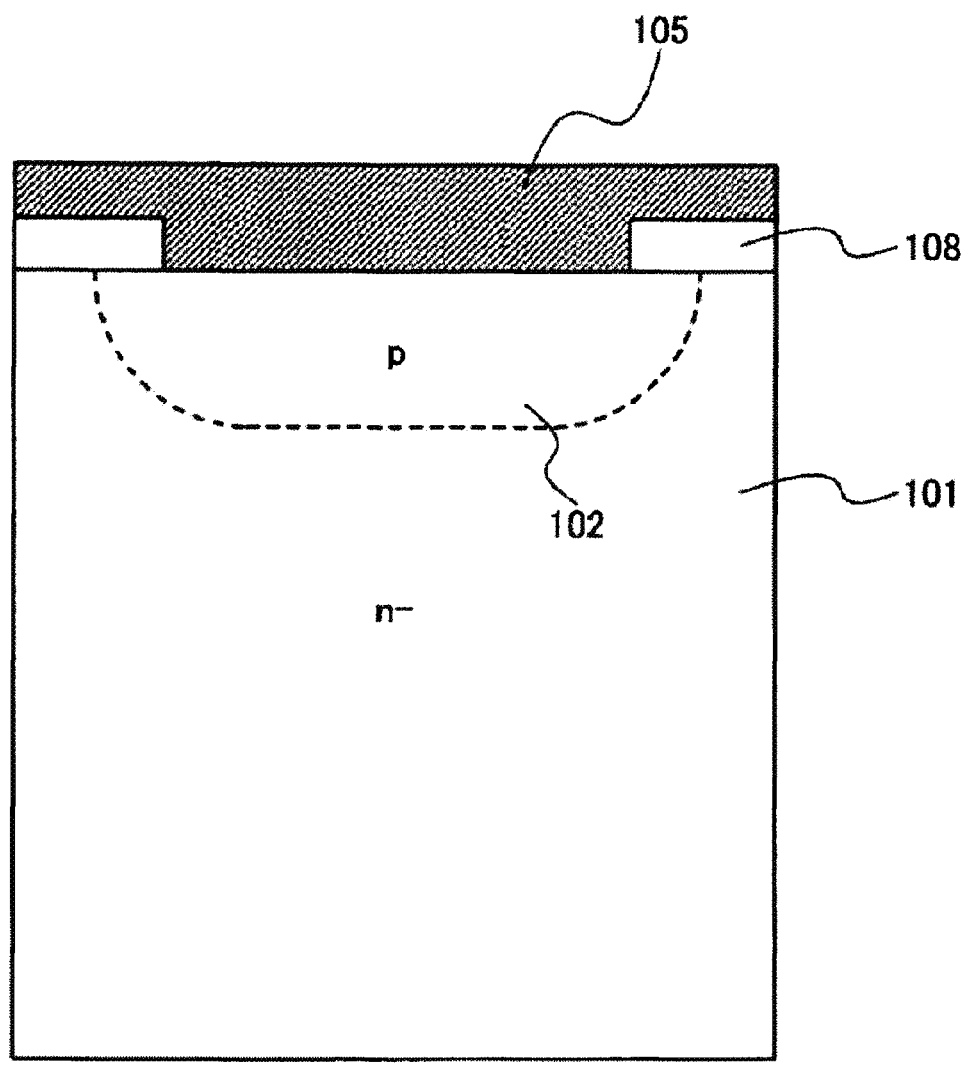
FIG. 3 is a cross-sectional view (part 2) illustrating the process of producing the active portion of the diode according to the invention.

Then, as illustrated in FIG. 3, for example, boron (B) ions are implanted from the main surface of the n$^-$ semiconductor substrate 101, using the oxide film 108 as a mask, and a heat treatment is performed to form the p-type anode layer 102. In addition, metal is sputtered to form the anode electrode 105 on the p-type anode layer 102. Reference numeral 108 is an insulating layer which is the oxide film.

Figure 4:
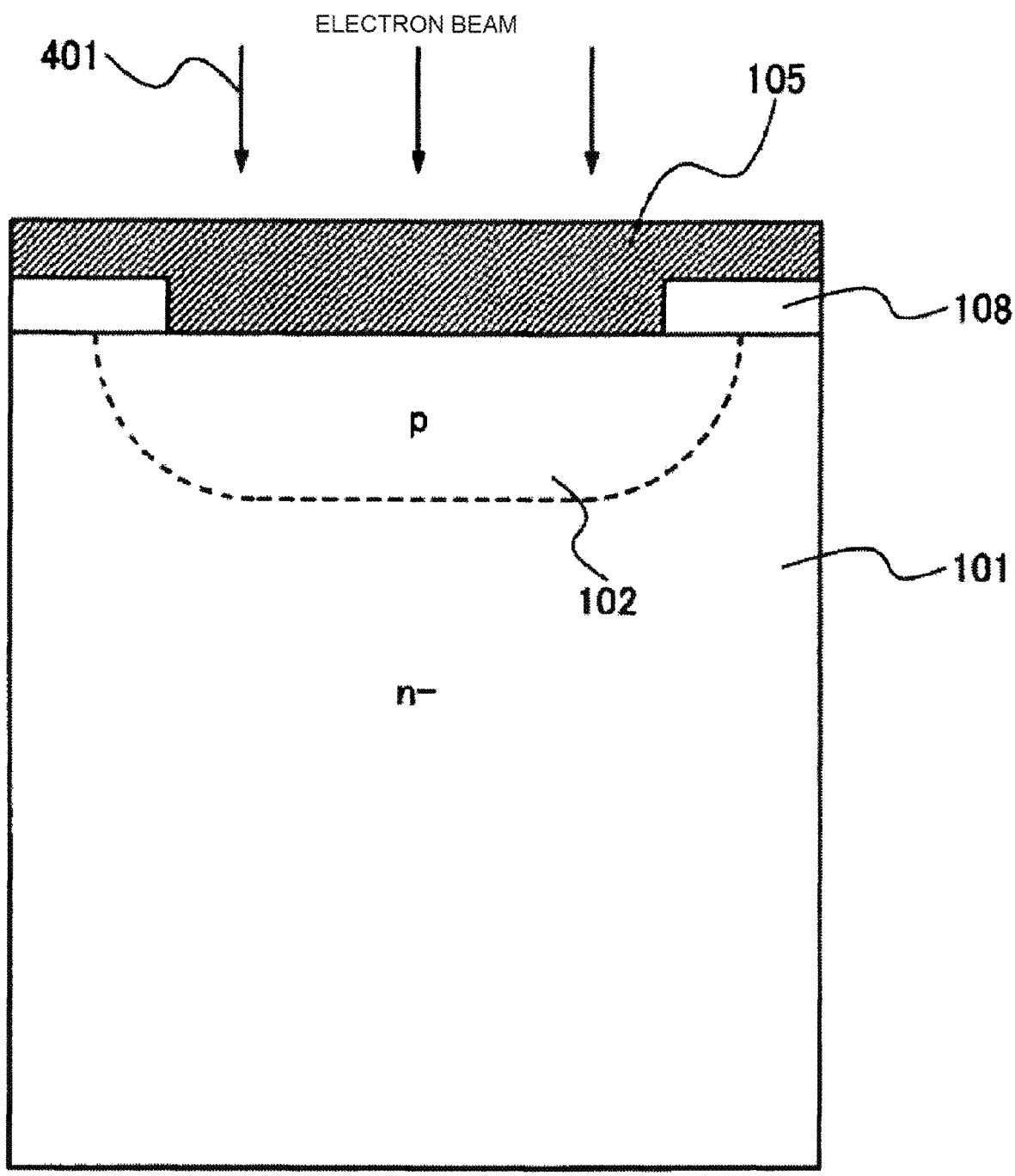
FIG. 4 is a cross-sectional view (part 3) illustrating the process of producing the active portion of the diode according to the invention.
Figure 5:
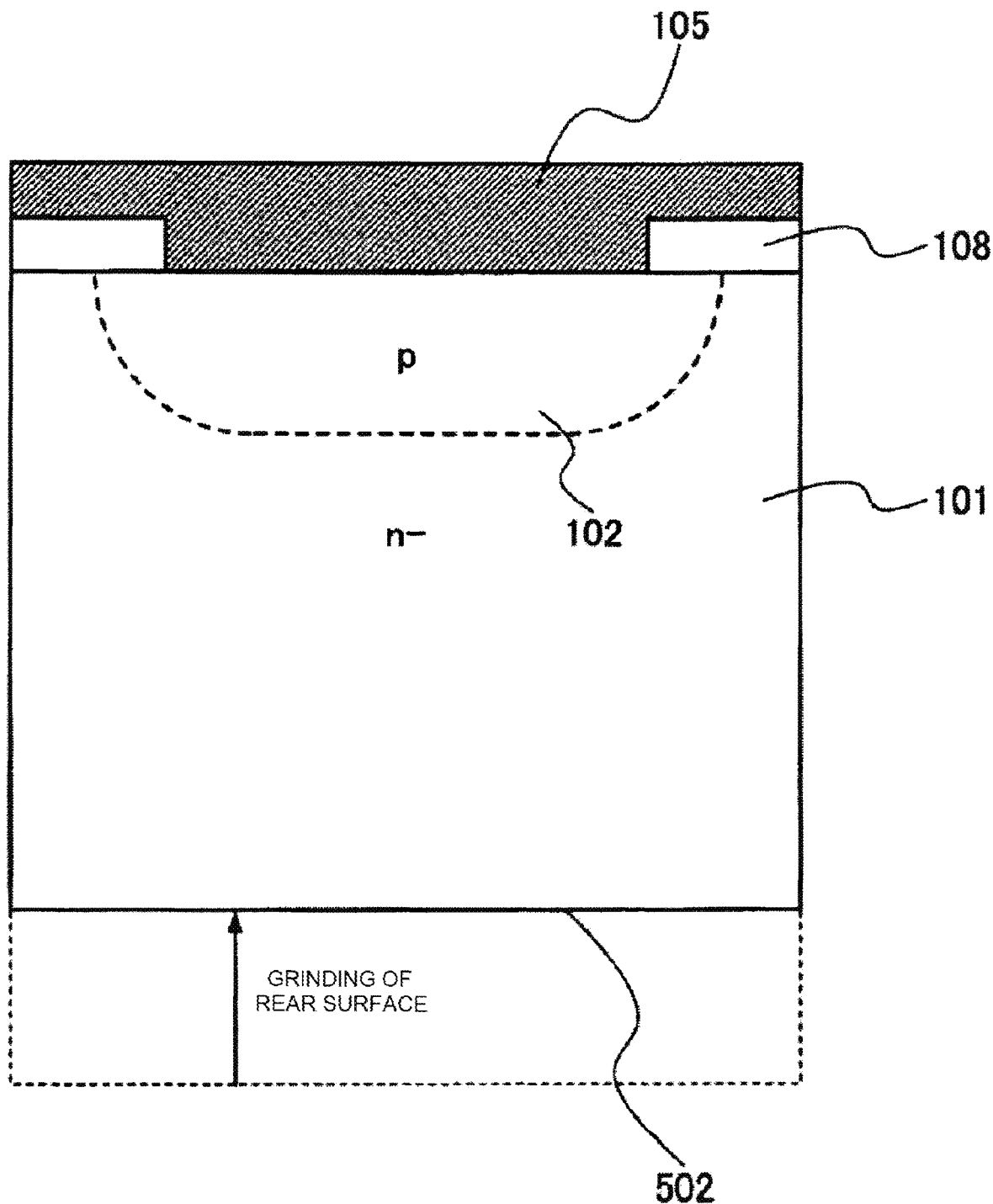
FIG. 5 is a cross-sectional view (part 4) illustrating the process of producing the active portion of the diode according to the invention.

Then, a front surface protection film (not illustrated) which covers the anode electrode 105 is formed. As illustrated in FIG. 4, electron beams 401 are radiated to the front surface and a heat treatment is performed to perform lifetime killer control. Then, as illustrated in FIG. 5, the n$^-$ semiconductor substrate 101 is ground from the rear surface to a position 502 corresponding to the thickness of a product which is used as the semiconductor device 100.

Figure 6:
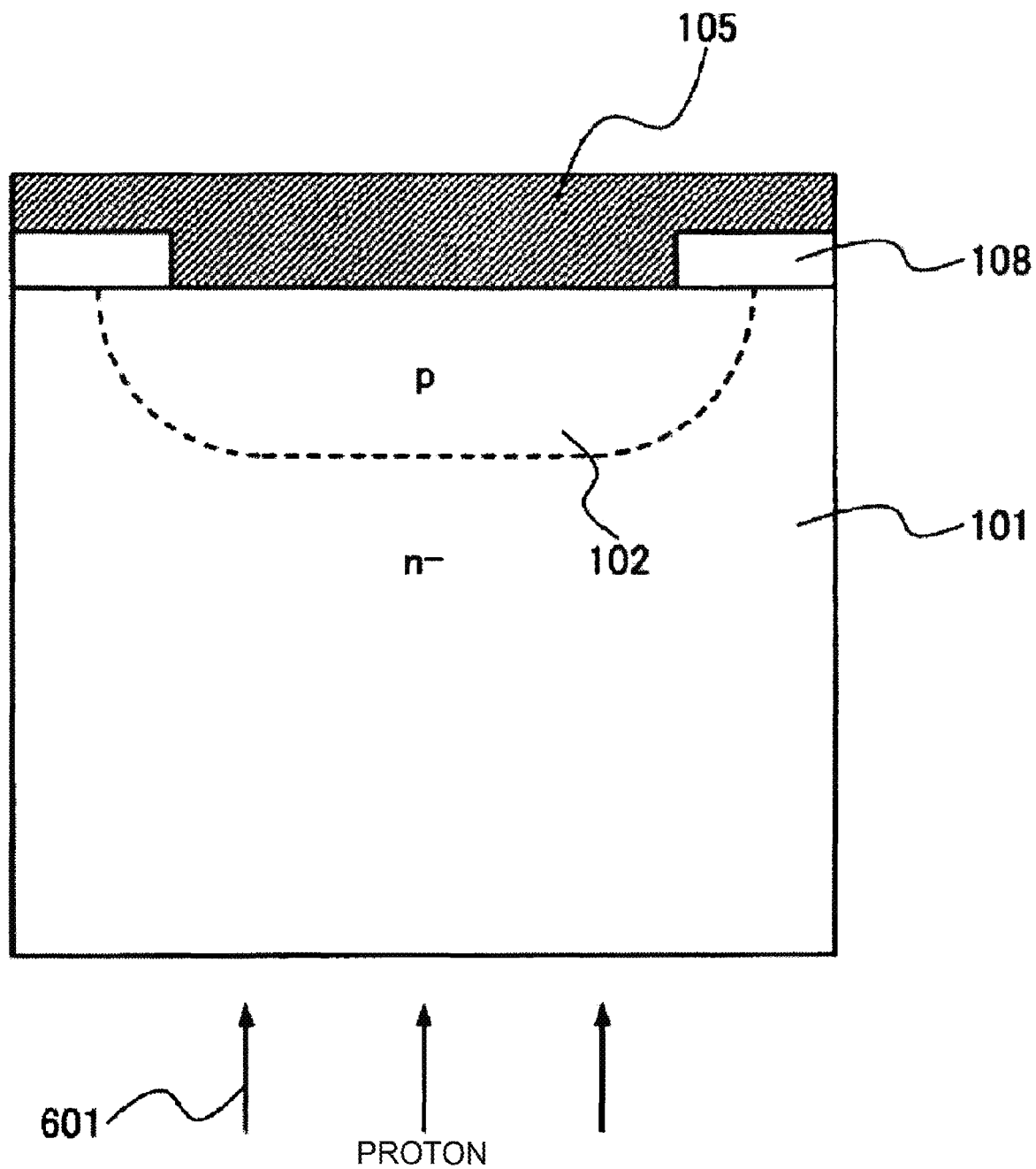
FIG. 6 is a cross-sectional view (part 5) illustrating the process of producing the active portion of the diode according to the invention.
Figure 7:
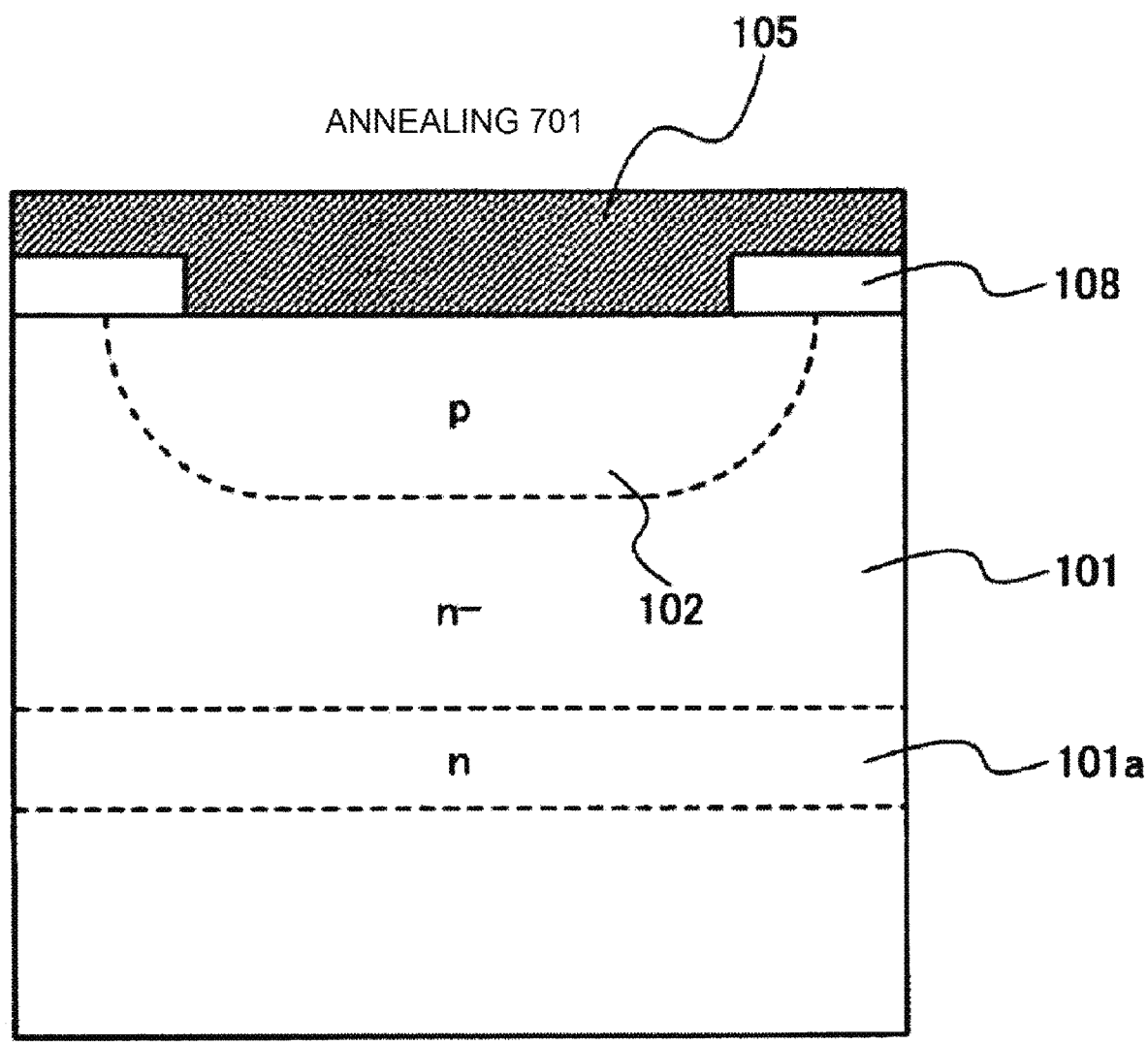
FIG. 7 is a cross-sectional view (part 6) illustrating the process of producing the active portion of the diode according to the invention.

Then, as illustrated in FIG. 6, a proton 601 is implanted into the rear surface of the n$^-$ semiconductor substrate 101 with predetermined implantation energy and a predetermined dose. Then, as illustrated in FIG. 7, annealing 701 is performed in a hydrogen (H$_2$) atmosphere at a predetermined temperature in a furnace in order to generate a donor region (the n layer 101a serving as the field stop layer) of the proton 601. The n layer 101a is provided so as to be separated from the p-type anode layer 102 and the n$^+$ cathode layer 101b.

The implantation energy of the proton 601 is in the range of 0.3 MeV to 10 MeV, for example, 2.1 MeV (a range Rp is 51 μm) and the dose thereof is 1×10$^{14}$/cm$^2$. When the implantation energy of the proton 601 is in the range of 1.0 MeV to 5.0 MeV, the range Rp of the proton 601 is in the range of 16 μm to 220 μm. In particular, when the implantation energy of the proton 601 is equal to or greater than 1.0 MeV, the range Rp of the proton 601 is equal to or greater than 16 μm and an oscillation inhibitory effect during reverse recovery is improved, which is preferable. The oscillation inhibitory effect during reverse recovery will be described below. When the implantation energy of the proton 601 is in the range of 2.0 MeV to 3.0 MeV, the range Rp of the proton 601 is in the range of 20 μm to 100 μm.

The dose of the proton 601 may be, for example, in the range of about 3×10$^{12}$/cm$^2$ to 5×10$^{14}$/cm$^2$. Preferably, the dose of the proton 601 is in the range of about 1×10$^{13}$/cm$^2$ to 1×10$^{14}$/cm$^2$ such that defect recovery and the rate of change into a donor are in desired states. Annealing 701 for generating a donor may be performed, for example, at a temperature of 420° C. in an atmosphere in which hydrogen concentration is in a range of 6% to 30%. The processing time of the annealing 701 may be, for example, about 1 to 10 hours. Preferably, the processing time of the annealing 701 may be, for example, in the range of about 3 hours to 7 hours. This is because the range of the processing time makes it possible to stabilize a temperature variation for 1 hour from the start of the annealing 701. In order to reduce production costs, the processing time of the annealing 701 may be, for example, in the range of about 1 hour to 5 hours.

Figure 8:
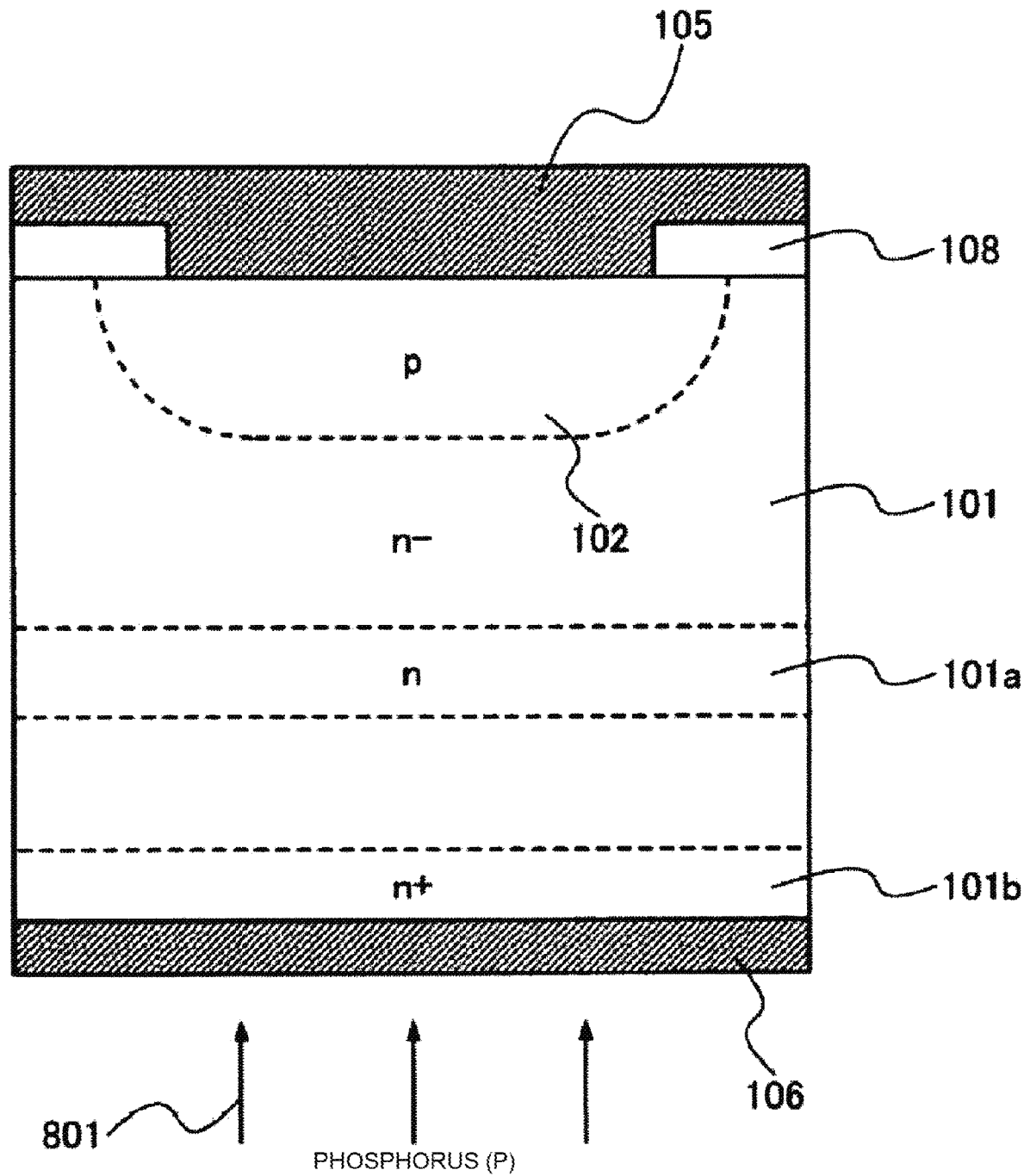
FIG. 8 is a cross-sectional view (part 7) illustrating the process of producing the active portion of the diode according to the invention.

Then, as illustrated in FIG. 8, for example, phosphorus (P) ion implantation 801 is performed from the rear surface of the n$^-$ semiconductor substrate 101 and a heat treatment is performed to form an n$^+$ layer (the n$^+$ cathode layer 101b; hereinafter, referred to as an n$^+$ layer 101b). Then, metal is sputtered to form the cathode electrode 106 on the rear surface of the n$^-$ semiconductor substrate 101. The n layer 101a and the n$^+$ layer 101b form a field stop region and have an impurity concentration higher than the n$^-$ drift region (n$^-$ semiconductor substrate 101). In this way, the active portion of the diode illustrated in FIG. 1 is completed.

EXAMPLE

Figure 9:
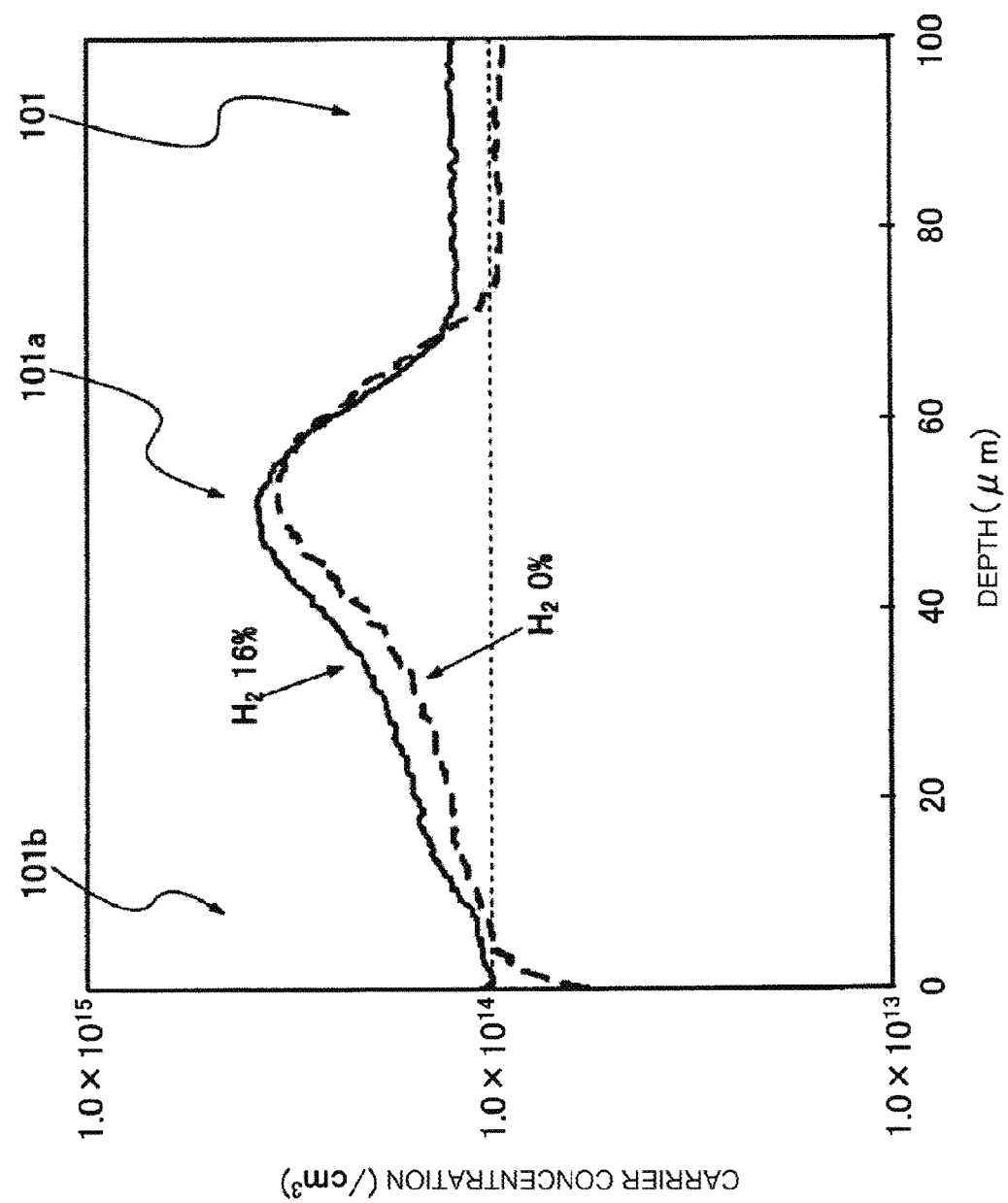
FIG. 9 is a diagram illustrating the measurement result of a carrier concentration distribution in a depth direction after annealing in the process of producing the active portion of the diode according to the first embodiment.

Next, the characteristics of the semiconductor device 100 having the above-mentioned structure will be described. FIG. 9 is a diagram illustrating the measurement result of a carrier concentration distribution in the depth direction after annealing in the process of producing the active portion of the diode according to the first embodiment. FIG. 9 illustrates the measurement result of the carrier concentration distribution in a portion corresponding to the X-X' axis of FIG. 1 by a spreading resistance analysis (SRA) method when annealing is performed at a hydrogen concentration of 0% and 16% in a furnace for proton annealing (which holds for FIGS. 22 to 24). The carrier concentration measured by the SRA method substantially indicates doping concentration when the mobility of carriers is equal to an ideal value of a crystal. In contrast, when there are many crystal defects or crystal disorder is large, mobility is reduced. Therefore, spreading resistance increases and low carrier concentration is measured (that is, apparently, doping concentration is reduced). In FIG. 9, the position of 0 is the boundary between the cathode electrode 106 and the n$^+$ layer 101b (which holds for FIGS. 22 to 24). When the hydrogen concentration is 16%, carrier concentration is entirely increased by the generation of donors in both a region from the n layer 101a to the n$^+$ layer 101b and a region from the n layer 101a to the n$^-$ drift region (n$^-$ semiconductor substrate 101), as compared to when the hydrogen (H$_2$) concentration is 0%.

Figure 10:
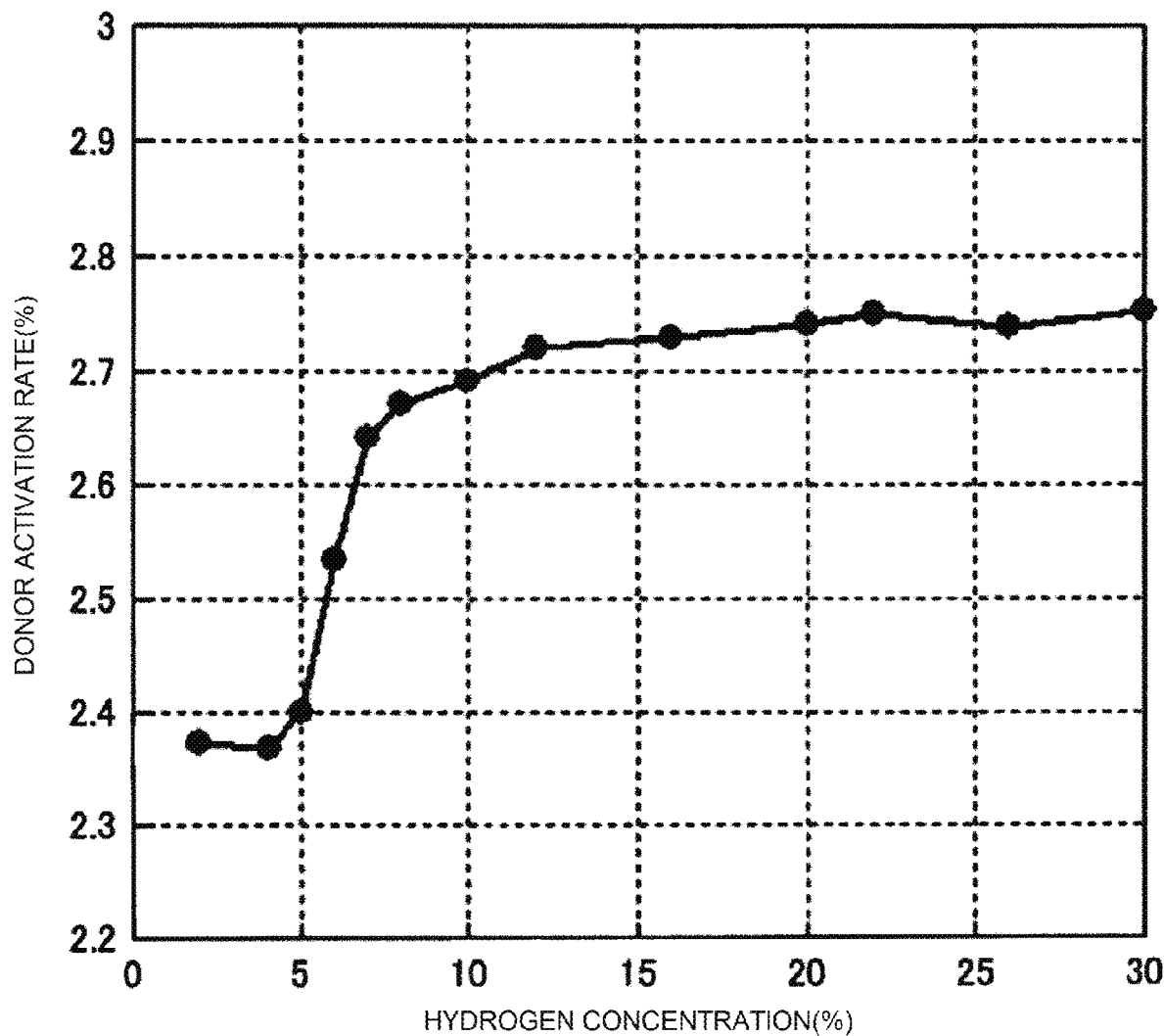
FIG. 10 is a diagram illustrating the relationship between hydrogen concentration and a donor generation rate.

FIG. 10 is a diagram illustrating the relationship between a donor generation rate and hydrogen concentration. The dependence of the donor generation rate with respect to a proton dose on hydrogen concentration during annealing will be described with reference to FIG. 10. A donor activation rate (%) is used as the donor generation rate. For example, the donor activation rate is 2% when the proton dose is $1\times10^{14}/cm^2$ and $2\times10^{12}/cm^2$ of donors are generated. The donor activation rate (unit: $cm^2$) is calculated by integrating a protruding region (a mountain in FIG. 9) of the measured proton-donor concentration distribution (unit: $cm^3$) with respect to a depth.

Experimental values are as follows: a proton dose is $1\times10^{14}/cm^2$; and when hydrogen concentration is 0%, the amount of donors is $2.370\times10^{12}/cm^2$ and the activation rate is 2.37%. When hydrogen concentration is 16%, the amount of donors is $2.760\times10^{12}/cm^2$ and the activation rate is 2.76%. As illustrated in FIG. 10, when the hydrogen concentration increases, the donor generation rate increases from 6% and is saturated at 30%. It is guessed that the saturation characteristics are obtained since all oxygen which is substituted with hydrogen from the VO defect is changed into donors. Here, the VO defect is a composite defect of a vacancy (V) and oxygen (O). When the hydrogen concentration is higher than necessary, a danger of explosion increases. Therefore, it is effective to perform furnace annealing in an atmosphere in which hydrogen concentration is in the range of 6% to 30% after proton implantation in order to improve the donor generation rate. In addition, the hydrogen concentration is preferably equal to or greater than 10% and equal to or less than 30% and more preferably equal to or greater than 15% and equal to or less than 25%, in order to stabilize the donor activation rate at 2.7% or more and to sufficiently reduce the danger of explosion.

As described above, according to the first embodiment, after proton implantation, the heat treatment is performed in a hydrogen atmosphere in which hydrogen concentration is in a range of 6% to 30%. Therefore, it is possible to introduce hydrogen into silicon, using a method other than proton implantation. A large amount of hydrogen terminates the dangling bond of a crystal defect and accelerates the recovery of a crystal.

According to the production method according to the first embodiment, it is possible to reduce a dose required to generate donors and to reduce the annealing temperature of the furnace. Therefore, it is possible to reduce the processing time (lead time) and to reduce the chip cost of the semiconductor device 100.

Second Embodiment

Next, a method for producing a semiconductor device according to a second embodiment will be described. The method for producing the semiconductor device according to the second embodiment differs from the method for producing the semiconductor device according to the first embodiment in the implantation energy (also referred to as acceleration energy) and annealing conditions of a proton. The method for producing the semiconductor device according to the second embodiment is the same as the method for producing the semiconductor device according to the first embodiment except for the annealing conditions of the proton.

Specifically, first, similarly to the first embodiment, a process from the formation of a p-type anode layer 102 to the implantation of a proton 601 is performed (FIGS. 2 to 6). The acceleration energy of the proton is, for example, 1.1 MeV (a range Rp is 18 μm). Then, for example, annealing 701 is performed at a temperature of 350° C. for 10 hours in an atmosphere in which hydrogen concentration is in the range of 6.0% to 30.0% to form a donor region (n layer 101a) (FIG. 7). Then, similarly to the first embodiment, a process of forming an $n^+$ layer 101b using phosphorus ion implantation and laser annealing and the subsequent processes are performed (FIG. 8). In this way, the diode illustrated in FIG. 1 is completed.

Figure 22:
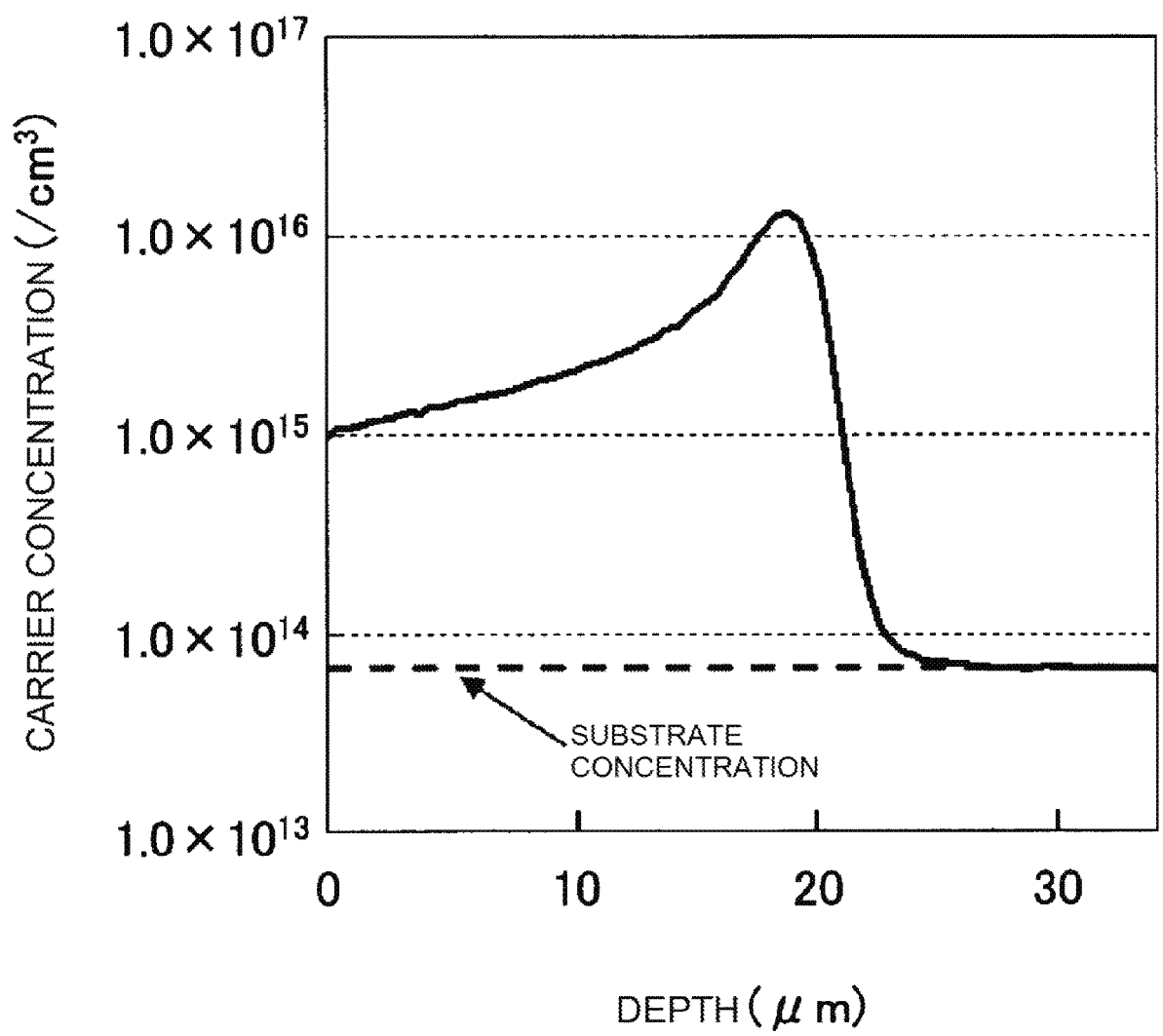
FIG. 22 is a characteristic diagram illustrating the measurement result of a carrier concentration distribution in a depth direction after annealing in the process of producing an active portion of a diode according to a second embodiment.

FIG. 22 illustrates the measurement result of the carrier concentration distribution of the produced diode in the depth direction by an SRA method. FIG. 22 is a characteristic diagram illustrating the measurement result of the carrier concentration distribution in the depth direction after annealing in a process of producing an active portion of the diode according to the second embodiment. As illustrated in FIG. 22, since carrier concentration in the vicinity of an implantation surface of the proton 601 and in a passage region of the proton 601 is higher than the impurity concentration of the $n^-$ semiconductor substrate 101 (substrate concentration represented by a dotted line, which holds for FIGS. 23 and 24), it is possible to generate the donor region while recovering a crystal defect (disorder) in the second embodiment.

As described above, according to the second embodiment, it is possible to obtain the same effect as that of the first embodiment. According to the second embodiment, since the annealing temperature of protons is equal to or less than 350° C., it is possible to form all front surface structures (for example, a p-type anode layer, an anode electrode, and an interlayer insulating film) on a thick $n^-$ semiconductor substrate before the rear surface is ground. Therefore, it is possible to reduce the number of processes which are performed for a thin $n^-$ semiconductor substrate. As a result, it is possible to improve yield and to reduce the costs of production facilities. In addition, according to the second embodiment, since the annealing temperature of protons is equal to or less than 350° C., it is possible to radiate electron beams to the thick $n^-$ semiconductor substrate before the rear surface is ground. Therefore, it is possible to improve yield. In addition, the rate of change into donors is the highest when the annealing temperature is equal to or higher than 300° C. and equal to or lower than 350° C. (for example, 10% to 50%). When an annealing process is performed in this temperature range, it is possible to maintain a high rate of change from protons to donors.

Third Embodiment

Next, a method for producing a semiconductor device according to a third embodiment will be described. The method for producing the semiconductor device according to the third embodiment differs from the method for producing the semiconductor device according to the first embodiment in that proton annealing is performed at a temperature that is equal to or higher than 330° C. and equal to or lower than 380° C. such that defect recovery and the rate of change into a donor are in desired states. Therefore, in the third embodiment, the order of processes is different from that in the first embodiment and electron beam irradiation and a heat treatment for lifetime control are performed after the proton annealing.

Specifically, first, similarly to the first embodiment, a process from the formation of a p-type anode layer to the formation of a front surface protection film is performed. Then, an $n^-$ semiconductor substrate is ground from the rear surface to a position corresponding to the thickness of a product which is used as a semiconductor device. Then, protons are implanted into the rear surface of the $n^-$ semiconductor substrate and annealing is performed at a temperature of, for example, 380° C. for 5 hours in an atmosphere in which hydrogen concentration is equal to or greater than 6.0% and less than 30.0% to form a donor region. Then, electron beams are radiated to the front surface of the substrate and a heat treatment is performed to perform lifetime killer control. Then, similarly to the first embodiment, a process of forming an n$^+$ layer using phosphorus ion implantation and laser annealing and the subsequent processes are performed. In this way, the diode illustrated in FIG. 1 is completed.

Figure 23:
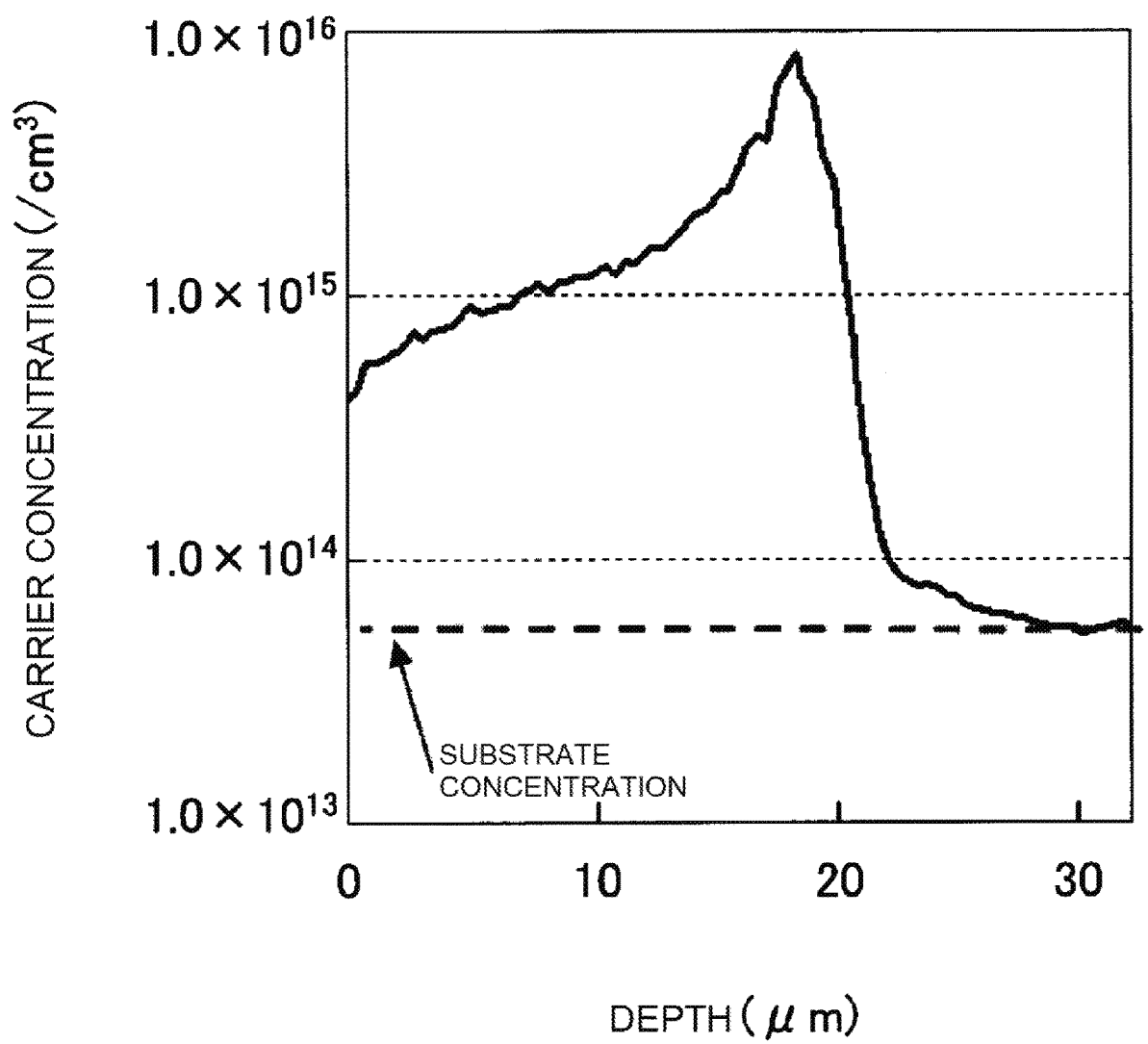
FIG. 23 is a characteristic diagram illustrating the measurement result of a carrier concentration distribution in a depth direction after annealing in the process of producing an active portion of a diode according to a third embodiment.

FIG. 23 illustrates the measurement result of the carrier concentration distribution of the produced diode in the depth direction by an SRA method. FIG. 23 is a characteristic diagram illustrating the measurement result of the carrier concentration distribution in the depth direction after annealing in a process of producing an active portion of the diode according to the third embodiment. As illustrated in FIG. 23, since carrier concentration in the vicinity of a proton implantation surface and in a passage region of the proton is higher than the impurity concentration of the n$^-$ semiconductor substrate, it is possible to generate the donor region while recovering a crystal defect (disorder) in the third embodiment.

As described above, according to the third embodiment, it is possible to obtain the same effect as that in the first embodiment. According to the third embodiment, since the annealing temperature of protons is equal to or less than 380° C., it is possible to reduce defects and to improve the rate of change into donors. In addition, similarly to the second embodiment, it is possible to form all front surface structures on a thick n$^-$ semiconductor substrate before the rear surface is ground. Therefore, it is possible to improve yield and to reduce costs.

Fourth Embodiment

Next, a method for producing a semiconductor device according to a fourth embodiment will be described. The method for producing the semiconductor device according to the fourth embodiment differs from the method for producing the semiconductor device according to the first embodiment in that proton annealing is performed at a temperature of 300° C. to 450° C. in order to increase the rate of change into donors. Therefore, in the fourth embodiment, the order of processes is different from that in the first embodiment and the formation of a front surface protection film, and electron beam irradiation and a heat treatment for lifetime control are performed after proton annealing.

Specifically, first, similarly to the first embodiment, a p-type anode layer and an anode electrode are formed. Then, an n$^-$ semiconductor substrate is ground from the rear surface to a position corresponding to the thickness of a product which is used as the semiconductor device. Then, protons are implanted into the rear surface of the n$^-$ semiconductor substrate and annealing is performed at a temperature of, for example, 420° C. for 3 hours in an atmosphere in which hydrogen concentration is equal to or greater than 6.0% and less than 30.0% to form a donor region. Then, a front surface protection film which covers the anode electrode is formed. Then, electron beams are radiated to the front surface of the substrate and a heat treatment is performed to perform lifetime killer control. Then, similarly to the first embodiment, a process of forming an n$^+$ layer using phosphorus ion implantation and laser annealing and the subsequent processes are performed. In this way, the diode illustrated in FIG. 1 is completed.

Figure 24:
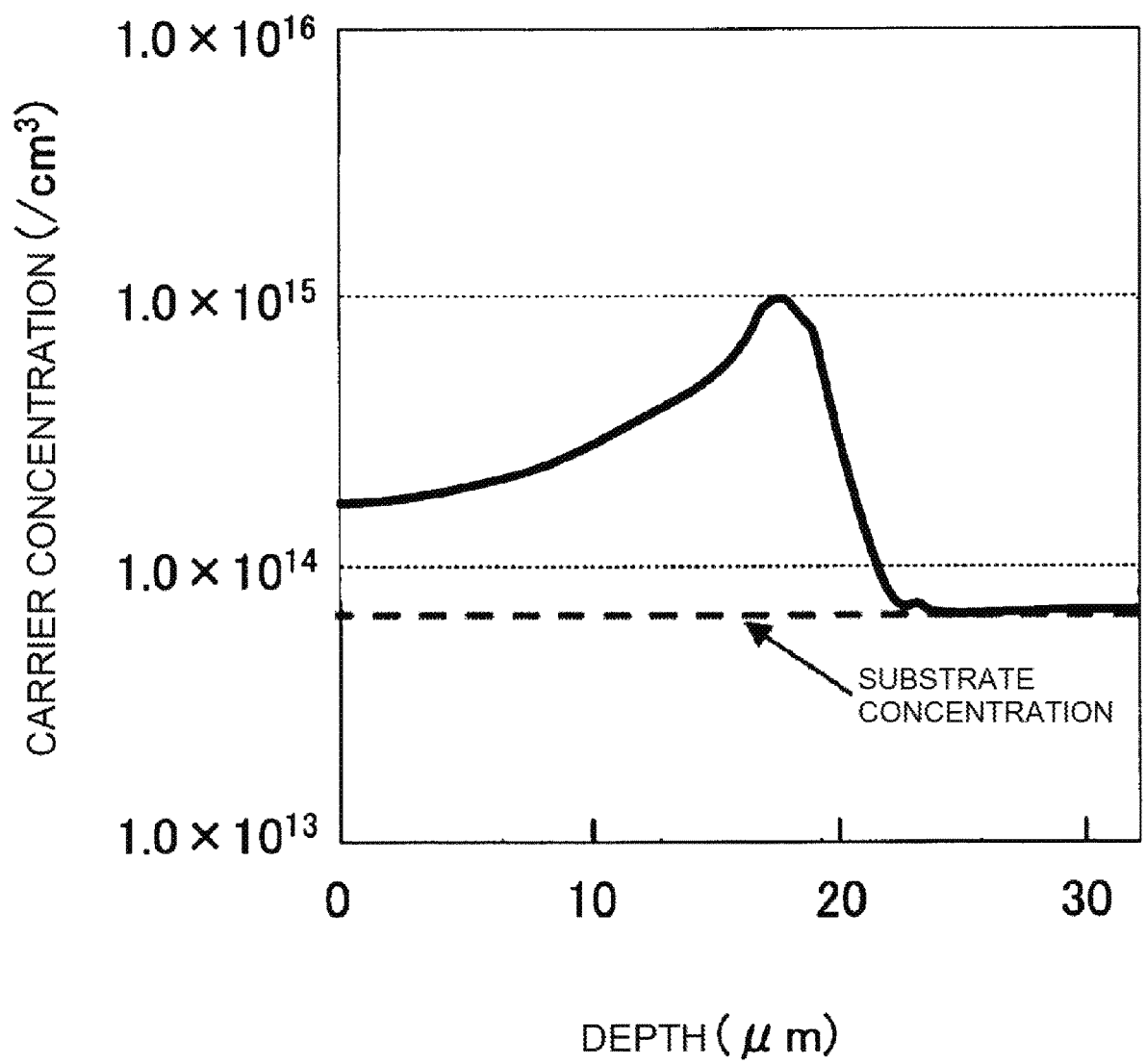
FIG. 24 is a characteristic diagram illustrating the measurement result of a carrier concentration distribution in a depth direction after annealing in the process of producing an active portion of a diode according to a fourth embodiment.

FIG. 24 illustrates the measurement result of the carrier concentration distribution of the produced diode in the depth direction by an SRA method. FIG. 24 is a characteristic diagram illustrating the measurement result of the carrier concentration distribution in the depth direction after annealing in a process of producing an active portion of the diode according to the fourth embodiment. As illustrated in FIG. 24, since carrier concentration in the vicinity of a proton implantation surface and in a passage region of the proton is higher than the impurity concentration of the n$^-$ semiconductor substrate, it is possible to generate the donor region while recovering a crystal defect (disorder) in the fourth embodiment. In addition, since the carrier concentration in the vicinity of the proton implantation surface and in the passage region of the proton is higher than that in the second and third embodiments, it is possible to stably recover a crystal defect, as compared to the second and third embodiments.

As described above, according to the fourth embodiment, it is possible to obtain the same effect as that in the first embodiment. In addition, according to the fourth embodiment, since the annealing temperature of the proton is high, the number of processes which are performed for a thin n$^-$ semiconductor substrate thickness increases after the rear surface is ground, but it is possible to stably recover a crystal defect.

Fifth Embodiment

Next, a method for producing a semiconductor device according to a fifth embodiment will be described. The method for producing the semiconductor device according to the fifth embodiment differs from the method for producing the semiconductor device according to the first embodiment in that oxygen is substituted for nitrogen in a normal pressure (for example, about 100,000 Pa) atmosphere to reduce the partial pressure of oxygen in a furnace and then proton annealing is performed. The fifth embodiment can be applied to the second to fourth embodiments.

As described above, according to the fifth embodiment, it is possible to obtain the same effect as that in the first embodiment. In addition, according to the fifth embodiment, since the partial pressure of oxygen in the furnace for performing proton annealing is reduced, it is possible to prevent explosion due to hydrogen.

Sixth Embodiment

Next, a method for producing a semiconductor device according to a sixth embodiment will be described. The method for producing the semiconductor device according to the sixth embodiment differs from the method for producing the semiconductor device according to the first embodiment in that measures to prevent explosion due to hydrogen gas are performed for the furnace for proton annealing. For example, a sealing member, such as an O-ring, is attached to a connection portion for connecting the inside of the furnace and the outside, such as an opening portion through which an n$^-$ semiconductor substrate is carried into the furnace, or a connection portion for connecting the furnace and a reaction gas pipe to improve the airtightness of the furnace. In this way, explosion due to hydrogen gas in the furnace is prevented.

Specifically, first, the n$^-$ semiconductor substrate (wafer) is carried into an annealing furnace at a normal pressure in an air atmosphere and the connection portion for connecting the inside of the furnace and the outside is sealed by the above-mentioned sealing member. Then, the internal pressure of the furnace is reduced to, for example, about 0.1 Pa to reduce the partial pressure of oxygen. Then, with the airtightness of the furnace being ensured by the sealing member, nitrogen gas and hydrogen gas are introduced into the furnace such that the furnace is in a normal pressure atmosphere. The internal temperature of the furnace is increased at a desired rate to the above-mentioned desired annealing temperature by an electric furnace and a proton annealing process is performed for the wafer. Then, the internal temperature of the furnace is reduced at a desired rate to the temperature at which the wafer is carried out. Then, with the airtightness of the furnace being ensured by the sealing member, the internal pressure of the furnace is reduced to, for example, about 0.1 Pa to sufficiently reduce the partial pressure of hydrogen. Then, nitrogen gas is introduced into the furnace such that the furnace is at a normal pressure. Then, the wafer is carried out. The sixth embodiment can be applied to the second to fourth embodiments.

As described above, according to the sixth embodiment, it is possible to obtain the same effect as that in the first embodiment. In addition, according to the sixth embodiment, the airtightness of the furnace for proton annealing is improved and the partial pressure of oxygen is reduced. Therefore, it is possible to prevent explosion due to hydrogen.

Seventh Embodiment

In the above-described embodiments, the semiconductor device producing method which forms the diode on the semiconductor substrate has been described above. However, the invention is not limited to the above-described embodiments. The invention can be similarly applied to produce an n layer (field stop layer) $101a$ of an insulated gate bipolar transistor (IGBT).

Figure 11:
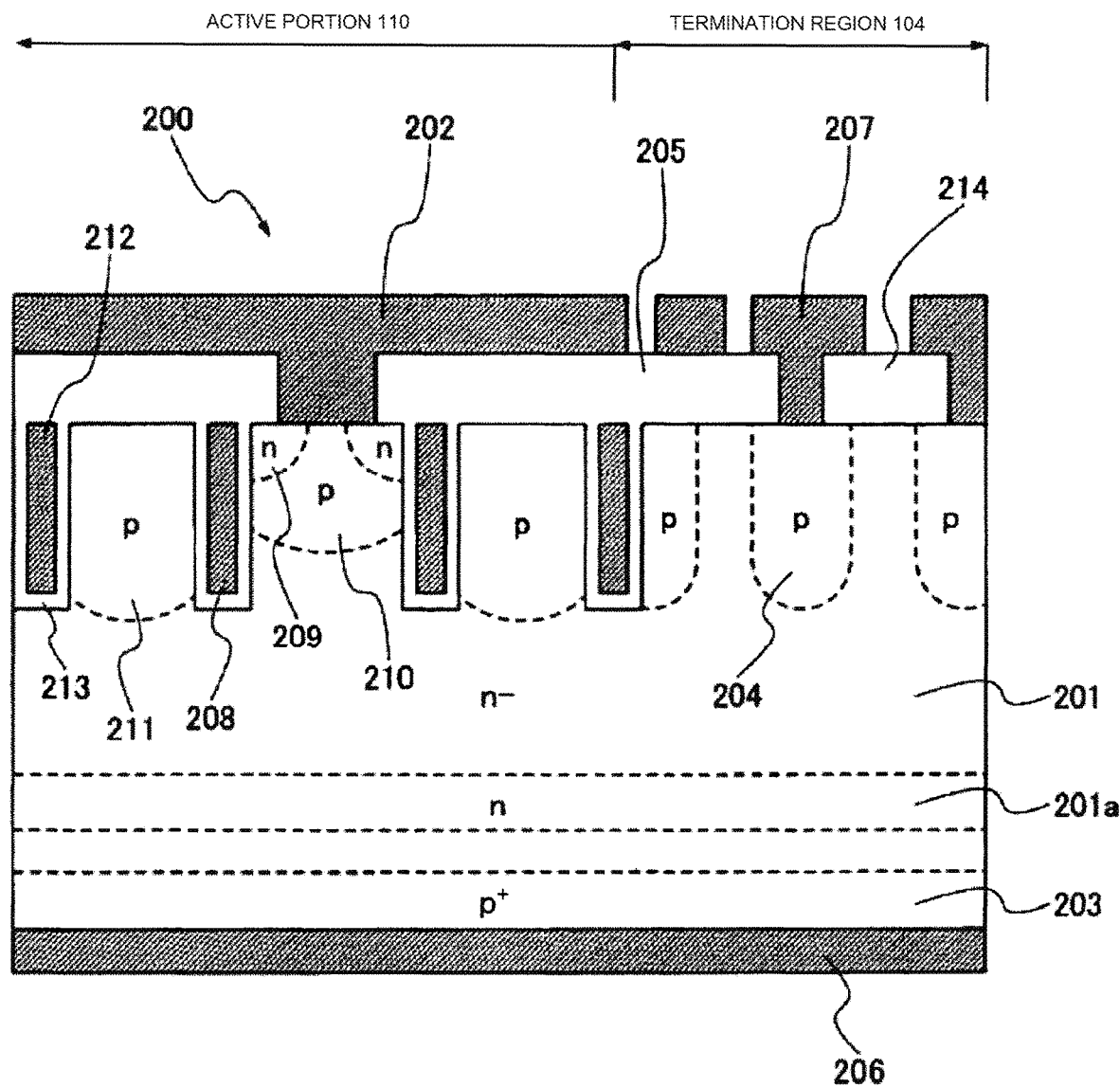
FIG. 11 is a cross-sectional view illustrating an IGBT as the semiconductor device according to the invention.
Figure 12:
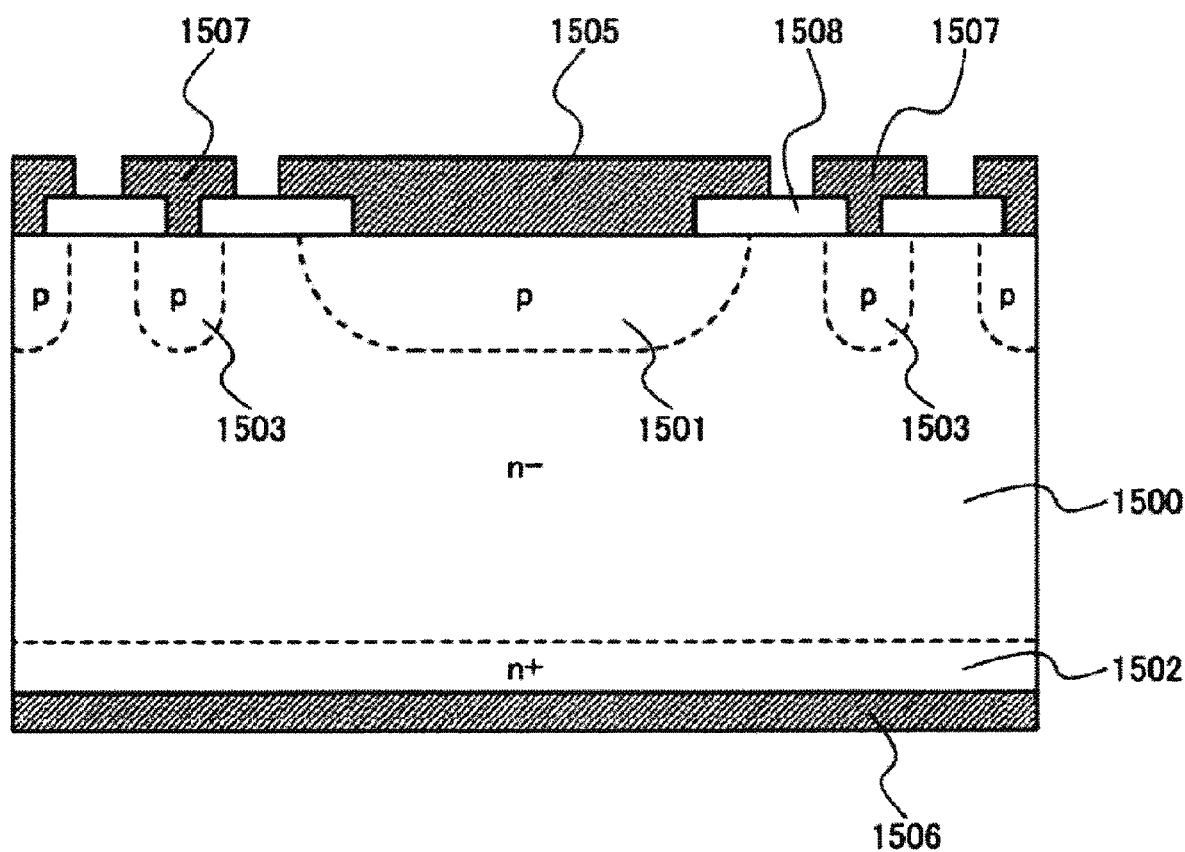
FIG. 12 is a cross-sectional view illustrating a diode according to the related art.
Figure 13A:
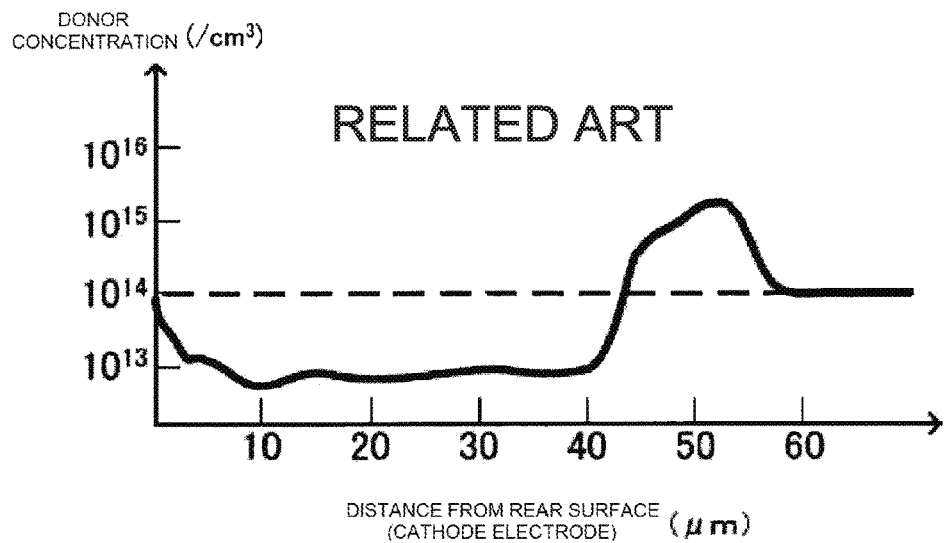
FIGS. 13A-13C are characteristic diagrams illustrating the comparison between the carrier concentration distributions in each range when the range Rp of proton implantation is about 15 μm and is greater than 15 μm.
Figure 13B:
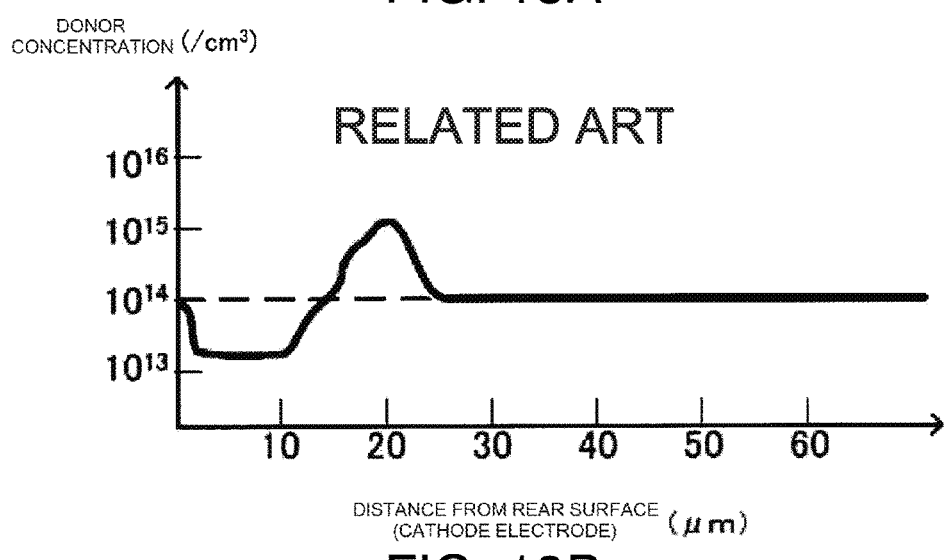
Figure 13C:
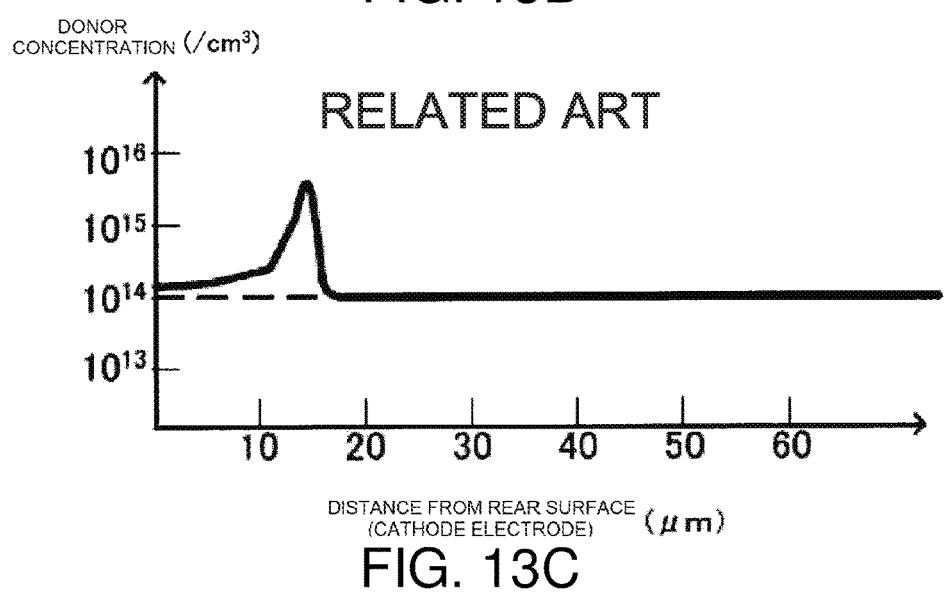

FIG. 11 is a cross-sectional view illustrating an IGBT as the semiconductor device according to the invention. In an IGBT 200, a p-type base layer 210 is formed in a surface layer of a main surface of an n$^-$ semiconductor substrate (n$^-$ drift region) 201. An n-type emitter layer 209 is formed in a surface layer of the p-type base layer 210. A trench gate electrode 208 is provided so as to be opposite to an n$^-$ drift region (n$^-$ semiconductor substrate 201), the p-type base layer 210, and an n-type emitter layer 209, with a gate oxide film 213 interposed therebetween. In this way, a metal-oxide-film-semiconductor (MOS) gate electrode is formed.

In addition, a floating p layer 211 with a floating potential is formed in a surface layer of the main surface of the n$^-$ semiconductor substrate 201 so as to come into contact with a side surface of the trench gate electrode 208 opposite to the p-type base layer 210. Then, a trench dummy gate 212 is formed through a gate oxide film 213 so as to be adjacent to the trench gate electrode 208 with the floating p layer 211 interposed therebetween. The potential of the dummy gate 212 may be floating potential or emitter potential. A p$^+$ collector layer 203 is formed in a surface layer of an opposite surface (rear surface). Then, a p-type guard ring 204 which will be a termination region 104 is formed in the outer circumference of the p-type base layer 210.

The IGBT 200 controls the doping concentration of n-type impurities at a deep position from the front surface to the rear surface in order to reduce voltage oscillation which causes noise during switching. FIG. 11 illustrates a state in which, after proton implantation, annealing is performed in a hydrogen atmosphere to accelerate the generation of donors, which are protons. For carrier concentration control, an n layer 201a is formed using proton implantation in which a deep range is obtained in silicon at a relatively low acceleration voltage. The n layer 201a becomes a field stop (FS) layer by proton implantation and has a higher impurity concentration than an n$^-$ drift region (n$^-$ semiconductor substrate 201).

An emitter electrode 202 is provided on the p-type base layer 210 and the n-type emitter layer 209 and a collector electrode 206 is provided on a lower surface of a p$^+$ collector layer 203 (the rear surface of the IGBT 200). An active portion 110 is a region in which a current flows when the IGBT is turned on and a termination region 104 is a region which reduces the electric field of the main surface of the n$^-$ semiconductor substrate (n$^-$ drift region) 201 and holds a breakdown voltage. For example, a p-type guard ring 204, which is a p-type floating region, and a field plate (FP) 207, which is a conductive film electrically connected to the guard ring 204, are provided in the termination region 104. Reference numeral 205 indicates an interlayer insulating film and reference numeral 214 indicates an insulating layer.

As described above, according to the fifth embodiment, it is possible to obtain the same effect as that in the seventh embodiment.

Eighth Embodiment

The position of the field stop layer will be described as an eighth embodiment. One or a plurality of field stop layers may be formed by proton implantation. Hereinafter, the preferred position of the proton peak of a first-stage field stop layer will be described in a plurality of proton implantation operations. The first-stage field stop layer means a field stop layer which is disposed at the deepest position from the rear surface of the substrate, which is an n$^+$ cathode layer in the case of a diode and is a p$^+$ collector layer in the case of an IGBT, in the depth direction.

Figure 15:
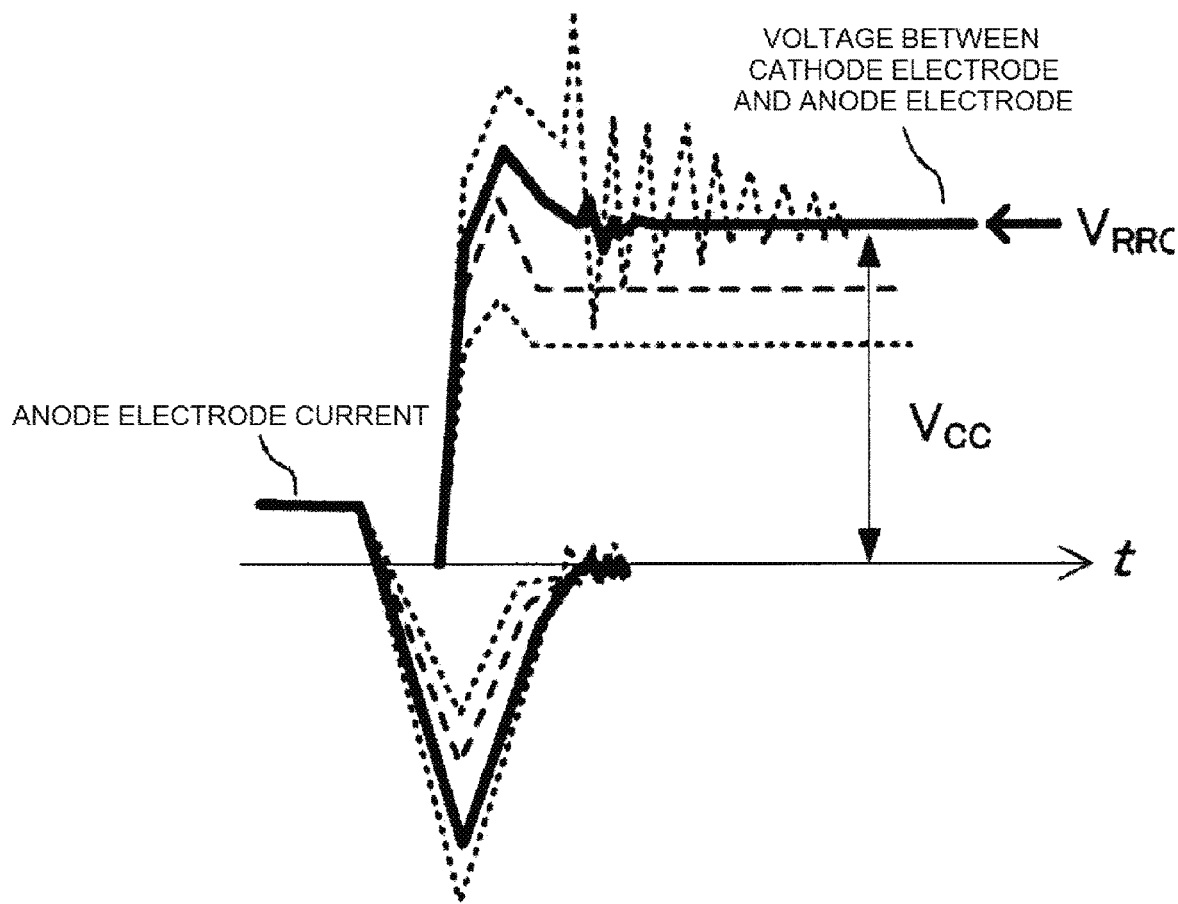
FIG. 15 is a diagram illustrating an oscillation waveform during reverse recovery of a general diode.

FIG. 15 illustrates an oscillation waveform during the reverse recovery of a general diode. When an anode current is equal to or less than a tenth of a rated current, oscillation is likely to occur before reverse recovery ends since the number of stored carriers is small. The anode current is fixed to a given value and the diode is reversely recovered by a different power supply voltage $V_{CC}$. In this case, when the power supply voltage $V_{CC}$ is greater than a predetermined value, the voltage is greater than the peak value of a general overshoot voltage in a voltage waveform between the cathode and the anode and then an additional overshoot occurs. Then, the additional overshoot (voltage) triggers the oscillation of the subsequent waveform. When the power supply voltage $V_{CC}$ is greater than the predetermined value again, an addition overshoot voltage further increases and the amplitude of the subsequent oscillation increases. As such, a threshold voltage at which the voltage waveform starts to oscillate is referred to as an oscillation start threshold value $V_{RRO}$. As the oscillation start threshold value $V_{RRO}$ increases, the possibility of the diode oscillating during reverse recovery is reduced, which is preferable.

The oscillation start threshold value $V_{RRO}$ depends on the position of a first proton peak which the end of a depletion layer (strictly, the end of a space-charge region since there is a hole), which is spread from a pn junction between the p-type anode layer and the n$^-$ drift region of the diode to the n$^-$ drift region, reaches first, among a plurality of proton peaks. The reason is as follows. When the depletion layer is spread from the p-type anode layer on the front surface side to the n$^-$ drift region during reverse recovery, the end of the depletion layer reaches the first field stop layer and the spreading of the depletion layer is suppressed. Therefore, the sweep of the stored carriers is weakened. As a result, the depletion of carriers is suppressed and oscillation is prevented.

During reverse recovery, the depletion layer is spread in the depth direction from the pn junction between the p-type anode layer and the n⁻ drift region to the cathode electrode. Therefore, the peak position of the field stop layer which the end of the depletion layer reaches first is the field stop layer which is closest to the pn junction between the p-type anode layer and the n⁻ drift region. It is assumed that the thickness of the n⁻ semiconductor substrate (the thickness of a portion interposed between the anode electrode and the cathode electrode) is $W_0$ and the depth of the peak position of the field stop layer which the end of the depletion layer reaches first from the interface between the cathode electrode and the rear surface of the n⁻ semiconductor substrate (hereinafter, referred to as a distance from the rear surface) is X. Here, a distance index L is introduced. The distance index L is represented by the following Expression (1).

$$L = \sqrt{\frac{\varepsilon_S V_{rate}}{q\left(\frac{J_F}{qv_{sat}} + N_d\right)}} \qquad \text{[Expression (1)]}$$

Figure 19A:
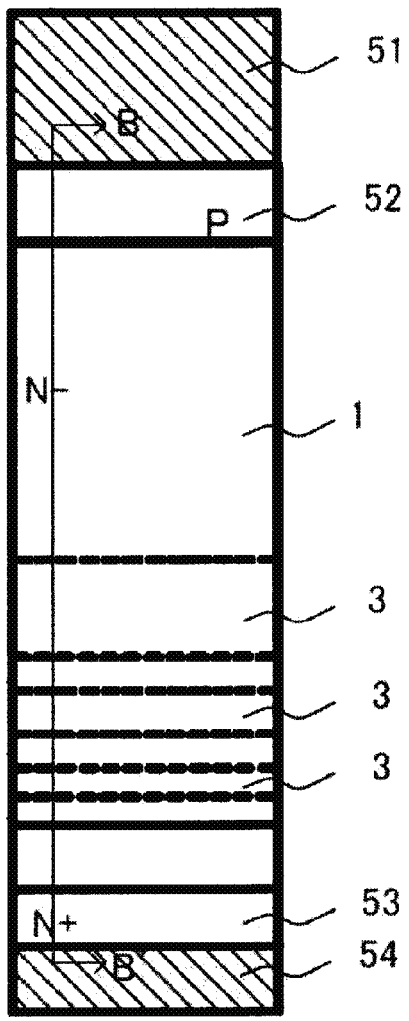
FIGS. 19A and 19B are diagrams illustrating a diode including a plurality of field stop layers.
Figure 19B:
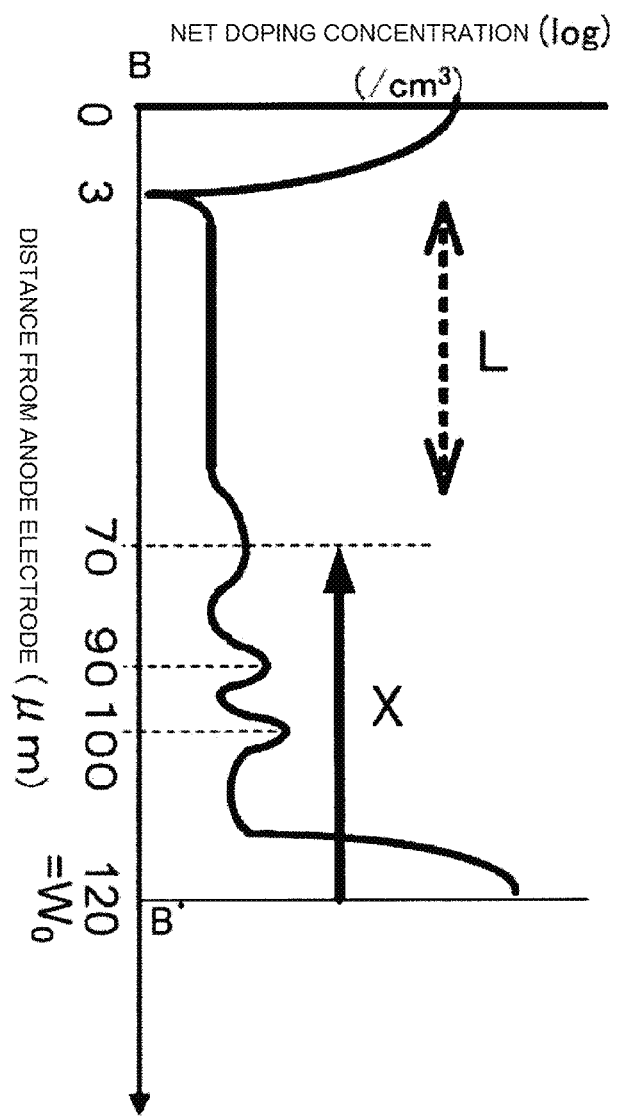

FIG. 17 is a diagram illustrating the position conditions of the field stop layer which the depletion layer reaches first in the semiconductor device according to the invention. FIGS. 19A and 19B are diagrams illustrating a diode including a plurality of field stop layers. FIG. 19A is a cross-sectional view illustrating the diode including a plurality of field stop layers 3. FIG. 19B illustrates a net doping concentration distribution along the cutting line B-B' of FIG. 19A. A p-type anode layer 52 is formed on a front surface of an n⁻ semiconductor substrate which will be an n⁻ drift region 1 and an n⁺ cathode layer 53 is formed on a rear surface. Reference numeral 51 indicates an anode electrode and reference numeral 54 indicates a cathode electrode. For example, the field stop layers 3 are formed in the n⁻ drift region 1 in three stages. In addition, the distance X of the peak position of the field stop layer 3, which is disposed at the deepest position from the rear surface of the substrate, from the rear surface of the substrate is 50 μm. This corresponds to a case in which the distance index L is 58.2 μm and γ, which will be described below, is 1.2 on the basis of the diagram illustrated in FIG. 17. An arrow L illustrated in FIG. 19B indicates, for example, a distance (length) from the pn junction between the p-type anode layer 52 and the n⁻ drift region 1.

Figure 18A:
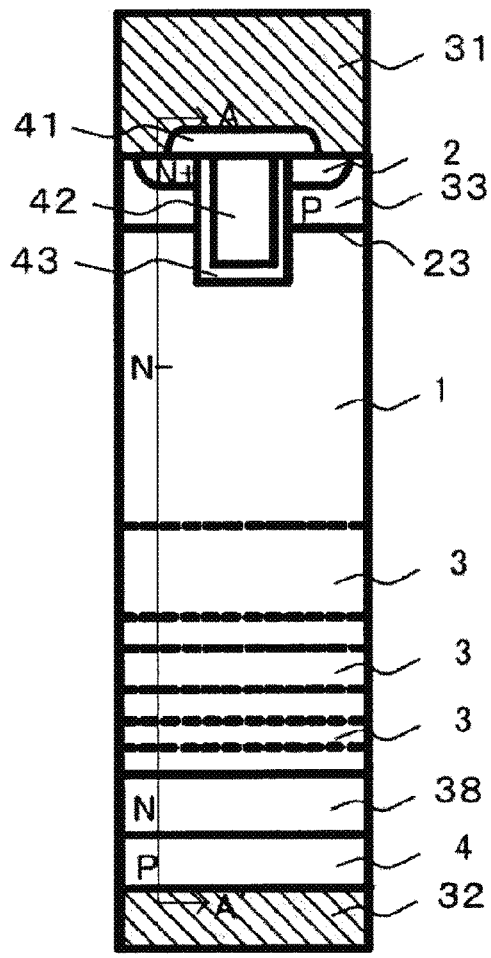
FIGS. 18A and 18B are diagrams illustrating an IGBT including a plurality of field stop layers.
Figure 18B:
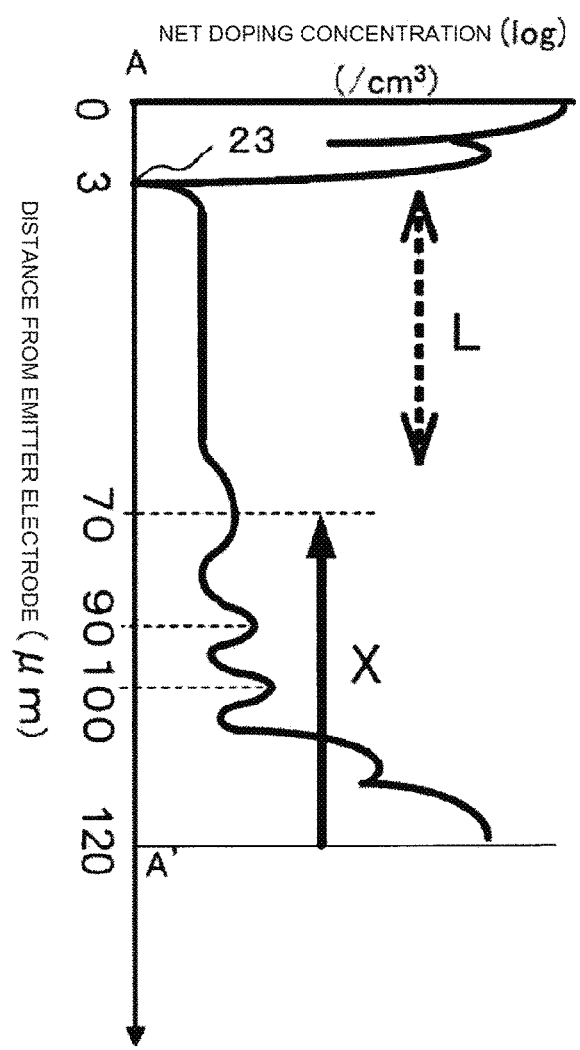

FIGS. 18A and 18B are diagrams illustrating an IGBT including a plurality of field stop layers. FIG. 18A is a cross-sectional view illustrating the IGBT including a plurality of field stop layers 3. FIG. 18B illustrates a net doping concentration distribution along the cutting line A-A' of FIG. 18A. A p-type base layer 33 is formed on a front surface of an n⁻ semiconductor substrate which will be an n⁻ drift region 1 and a p collector layer 4 is formed on a rear surface. Reference numeral 2 indicates an n⁺ emitter layer, reference numeral 23 indicates a pn junction between the p-type base layer 33 and the n⁻ drift region 1, reference numeral 31 indicates an emitter electrode, and reference numeral 32 indicates a collector electrode. In addition, reference numeral 38 indicates an n buffer layer, reference numeral 41 indicates an interlayer insulating film, reference numeral 42 indicates a gate electrode, and reference numeral 43 indicates a gate insulating film. For example, the field stop layers 3 are formed in the n⁻ drift region 1 in three stages. The distance X of the peak position of the field stop layer 3, which is disposed at the deepest position from the rear surface of the substrate, from the rear surface of the substrate is 50 μm. This corresponds to a case in which the distance index L is 58.2 μm from FIG. 17 and γ, which will be described below, is 1.2 on the basis of the diagram illustrated in FIG. 17. An arrow L illustrated in FIG. 18B indicates, for example, a distance (length) from the pn junction between the p-type base layer 33 and the n⁻ drift region 1.

Next, the reverse recovery oscillation of the diode will be described. The distance index L represented by the above-mentioned Expression (1) is an index indicating the distance of the end of the depletion layer (exactly, a space-charge region) (depletion layer end), which is spread from the pn junction between the p-type anode layer and the n⁻ drift region to the n⁻ drift region, from the pn junction when a voltage $V_{AK}$ between the cathode and the anode is the power supply voltage $V_{CC}$ during reverse recovery. In a fraction in the square root, a denominator indicates the space-charge density of the space-charge region (simply, the depletion layer) during reverse recovery. The known Poisson's equation is represented by divE=ρ/ε (where E is electric field intensity, ρ is the space-charge density, and ρ=q (p-n+$N_d$-$N_a$) is established). In addition, q is an elementary charge, p is hole concentration, n is electron concentration, $N_d$ is donor concentration, $N_a$ is acceptor concentration, and ε is the permittivity of a semiconductor. In particular, the donor concentration $N_d$ is average concentration obtained by integrating the n⁻ drift region in the depth direction and dividing the integrated value by the length of the integration section.

The space-charge density ρ is described by the hole concentration p in the space-charge region (depletion layer) during reverse recovery and the average donor concentration $N_d$ of the n⁻ drift region. The space-charge density ρ can be represented by ρ≈q(p+$N_d$) since the electron concentration is negligibly less than the space-charge density ρ and there is no acceptor. In this case, the hole concentration p is determined by a breaking current of the diode. In particular, the hole concentration p is represented by p=$J_F$/(q$v_{sat}$) since a situation in which the rated current density of the element flows is assumed (where $J_F$ is the rated current density of the element and $v_{sat}$ is a saturated speed at which the speed of carriers is saturated with predetermined electric field intensity).

The Poisson's equation is integrated with the distance x two times and a voltage V satisfies E=−gradV (the relationship between a known electric field E and the voltage V). Therefore, when boundary conditions are appropriate, V=(1/2) (ρ/ε) $x^2$ is established. The length x of the space-charge region when the voltage V is half of a rated voltage BV is the distance index L. The reason is that, in the actual device, such as an inverter, an operating voltage (power supply voltage $V_{CC}$), which is the voltage V, is about half of the rated voltage. When the doping concentration of the field stop layer is higher than the concentration of the n⁻ drift region, the field stop layer has a function of making it difficult for the space-charge region to be spread during reverse recovery. In a case in which the anode current of the diode starts to be reduced from the breaking current due to the turn-on of a MOS gate of the IGBT which is disposed at a different position on the circuit, when the peak position of the field stop layer which the depletion layer reaches first is in the range of the length of the space-charge region, it is possible to suppress the spreading of the space-charge region, with the stored carriers remaining in the n⁻ drift region. Therefore, the sweep of the remaining carriers is suppressed.

For example, in the actual reverse recovery operation, when an IGBT module is driven by a known PWM inverter, the power supply voltage $V_{CC}$ or the breaking current is not fixed, but is variable. Therefore, in this case, the preferred peak position of the field stop layer which the depletion layer reaches first needs to have a certain width. The inventors' examination result proved that the distance X of the peak position of the field stop layer which the depletion layer reached first from the rear surface was as illustrated in FIG. 17. FIG. 17 illustrates the distance X of the peak position of the field stop layer which the depletion layer reaches first from the rear surface at a rated voltage of 600 V to 6500 V. Here, $X=W_0-\gamma L$ is established and $\gamma$ is a coefficient. FIG. 17 illustrates the distance X when the coefficient $\gamma$ is changed from, for example, 0.7 to 1.6.

As illustrated in FIG. 17, the safe design is made at each rated voltage such that the element (diode) has a breakdown voltage that is about 10 percent higher than the rated voltage. As illustrated in FIG. 17, the total thickness of the n⁻ semiconductor substrate (the thickness of the n⁻ semiconductor substrate during a finishing process after the n⁻ semiconductor substrate is thinned by, for example, grinding) and the average specific resistance of the n⁻ drift region are set such that an on-voltage or reverse recovery loss is sufficiently reduced. The term "average" means the average concentration and specific resistance of the entire n⁻ drift region including the field stop layer. As illustrated in FIG. 17, the rated current density $J_F$ has a typical value, depending on the rated voltage. The rated current density $J_F$ is set such that energy density which is determined by the product of the rated voltage is substantially constant and substantially has the value illustrated in FIG. 17. When the distance index L is calculated by the above-mentioned Expression (1) on the basis of these values, the value illustrated in FIG. 17 is obtained. The distance X of the peak position of the field stop layer which the end of the depletion layer reaches first from the rear surface is obtained by subtracting the value of $\gamma$ which is in the range of 0.7 to 1.6 with respect to the distance index L from the thickness $W_0$ of the n⁻ semiconductor substrate.

Figure 14:
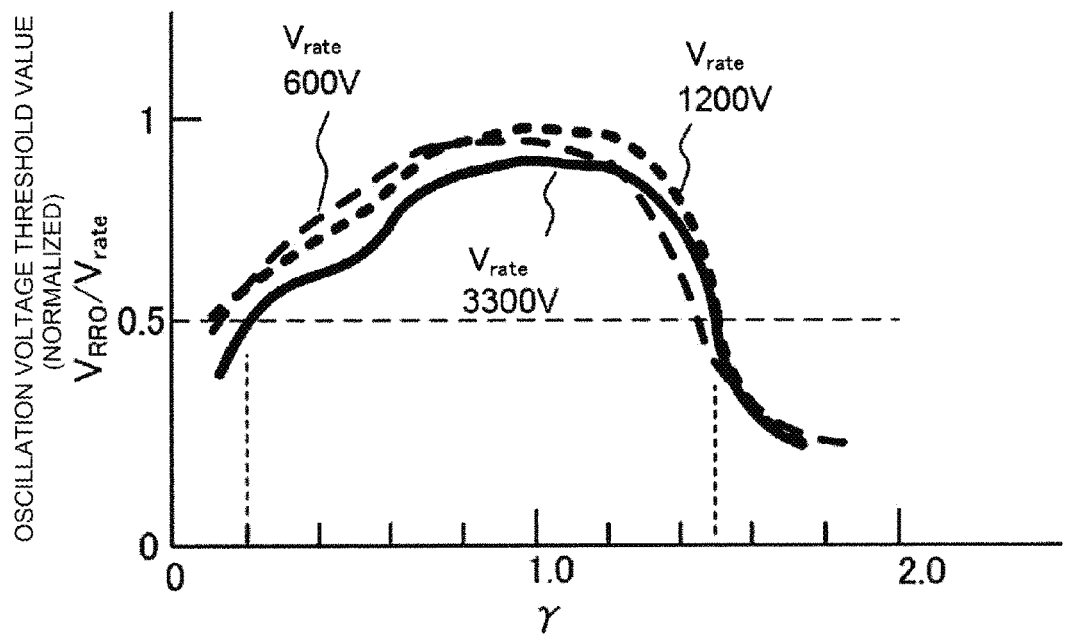
FIG. 14 is a characteristic diagram illustrating a threshold voltage at which a voltage waveform starts to oscillate.

The distance X of the peak position of the field stop layer which the end of the depletion layer reaches first from the rear surface, at which reverse recovery oscillation is sufficiently suppressed, with respect to the distance index L and the thickness $W_0$ of the n⁻ semiconductor substrate, is as follows. FIG. 14 is a characteristic diagram illustrating a threshold voltage at which the voltage waveform starts to oscillate. FIG. 14 illustrates the dependence of the oscillation start threshold value $V_{RRO}$ on $\gamma$ at some typical rated voltages $V_{rate}$ (600 V, 1200 V, and 3300 V). Here, the vertical axis indicates a value obtained by normalizing the oscillation start threshold value $V_{RRO}$ with the rated voltage $V_{rate}$. As can be seen from FIG. 14, it is possible to rapidly increase the oscillation start threshold value $V_{RRO}$ together with three rated voltages at $\gamma$ of 1.5 or less.

As described above, in the actual device, such as an inverter, the operating voltage (power supply voltage $V_{CC}$) which is the voltage V is about half of the rated voltage $V_{rate}$. Therefore, when the power supply voltage $V_{CC}$ is half of the rated voltage $V_{rate}$, at least the reverse recovery oscillation of the diode should not occur. That is, the value of $V_{RRO}/V_{rate}$ needs to be equal to or greater than 0.5. As illustrated in FIG. 14, when $\gamma$ is equal to or greater than 0.2 and equal to or less than 1.5, the value of $V_{RRO}/V_{rate}$ is equal to or greater than 0.5. Therefore, it is preferable that $\gamma$ be at least in the range of 0.2 to 1.5.

At a voltage between 600 V and 1200 V (for example, 800 V or 1000 V), a voltage between 1200 V and 3300 V (for example, 1400 V, 1700 V, or 2500 V), and a voltage equal to or higher than 3300 V (for example, 4500 V or 6500 V) which are not illustrated, the oscillation start threshold value $V_{RRO}$ does not greatly deviate from three curves illustrated in FIG. 14 and has the same dependence as the three curves (the oscillation start threshold value $V_{RRO}$ with respect to $\gamma$). As can be seen from FIG. 7, there is a region in which the oscillation start threshold value $V_{RRO}$ can be sufficiently increased at any rated voltage when $\gamma$ is in the range of 0.7 to 1.4.

When $\gamma$ is less than 0.7, the oscillation start threshold value $V_{RRO}$ is about equal to or higher than 80% of the rated voltage $V_{rate}$, but the avalanche breakdown voltage of the element is likely to be lower than the rated voltage $V_{rate}$ since the field stop layer is close to the p-type base layer. Therefore, it is preferable that $\gamma$ be equal to or greater than 0.7. When $\gamma$ is greater than 1.4, the oscillation start threshold value $V_{RRO}$ is rapidly reduced from about 70% of the rated voltage $V_{rate}$ and reverse recovery oscillation is likely to occur. Therefore, it is preferable that $\gamma$ be equal to or less than 1.4. In addition, $\gamma$ is more preferably in the range of 0.8 to 1.3 and most preferably in the range of 0.9 to 1.2. In this case, it is possible to maximize the oscillation start threshold value $V_{RRO}$ while increasing the avalanche breakdown voltage of the element to be sufficiently higher than the rated voltage $V_{rate}$.

The important point in FIG. 14 is that the range of $\gamma$ which can sufficiently increase the oscillation start threshold value $V_{RRO}$ is substantially the same (0.7 to 1.4) at any rated voltage $V_{rate}$. The reason is as follows: it is most effective to set the range of the distance X of the peak position of the field stop layer which the depletion layer reaches first from the rear surface to be centered on $W_0$-L ($\gamma$=1). It is most effective to include $\gamma$=1.0 since power density (the product of the rated voltage $V_{rate}$ and the rated current density $J_F$) is substantially constant (for example, $1.8\times10^5$ VA/cm² to $2.6\times10^5$ VA/cm²). That is, when the voltage of the element is equivalent to the rated voltage $V_{rate}$ during switching, such as turn-off, the distance (depth) of the end of the space-charge region is equal to about the distance index L represented by the above-mentioned Expression (1). When the peak position of the field stop layer which is disposed at the deepest position from the rear surface is aligned with the position of the distance index L (that is, $\gamma$ is about 1.0), it is possible to suppress oscillation during switching. Since power density is substantially constant, the distance index L is proportional to the rated voltage $V_{rate}$. Therefore, in the range which has $\gamma$=1 substantially as the center, it is possible to sufficiently increase the oscillation start threshold value $V_{RRO}$ at any rated voltage $V_{rate}$ and to maximize the oscillation inhibitory effect during reverse recovery.

As described above, when the distance X of the peak position of the field stop layer which the end of the depletion layer reaches first from the rear surface is set in the above-mentioned range, the stored carriers can sufficiently remain in the diode during reverse recovery and it is possible to suppress an oscillation phenomenon. Therefore, for the distance X of the peak position of the field stop layer which the end of the depletion layer reaches first from the rear surface, the coefficient $\gamma$ of the distance index L may be in the above-mentioned range at any rated voltage $V_{rate}$. In this case, it is possible to effectively suppress the oscillation phenomenon during reverse recovery.

As can be seen from FIG. 17, as described above, when the depth of the first (first-stage) field stop layer, which is disposed at the deepest position from the rear surface, from the rear surface is set such that γ is about 1 at a rated voltage $V_{rate}$ of 600 V or more, the distance index L is greater than 20 μm at any rated voltage $V_{rate}$. That is, the range Rp of protons for forming the first proton peak at the deepest position from the rear surface is deeper than 15 μm, particularly, equal to or deeper than 20 μm from the rear surface of the substrate in order to maximize the oscillation inhibitory effect.

As described above, in order to obtain good switching characteristics, it is necessary to form the field stop layer in a region which is deeper than at least 15 μm from the rear surface of the n⁻ semiconductor substrate. The concept of the distance index L and the preferred range of γ in the diode can be similarly applied to an IGBT. That is, reverse recovery oscillation may be considered to be replaced with turn-off oscillation. In this case, the likeliness of oscillation and the effect of suppressing the oscillation are the same as those for the reverse recovery oscillation.

Ninth Embodiment

Figure 16:
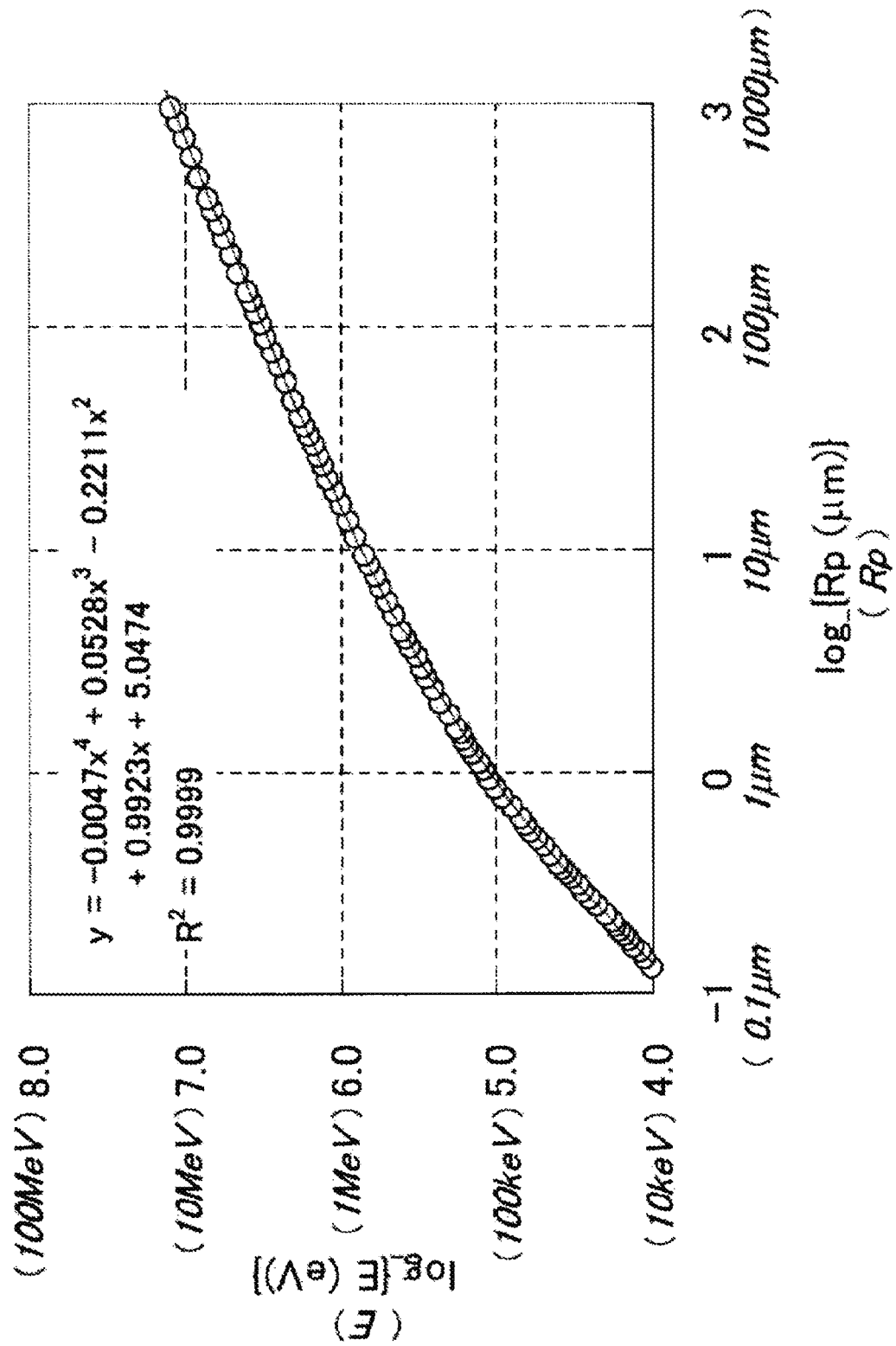
FIG. 16 is a characteristic diagram illustrating the relationship between the range of a proton and the acceleration energy of the proton in the semiconductor device according to the invention.

Next, the acceleration energy of a proton in the method for producing the semiconductor device according to the invention will be described as a ninth embodiment. The acceleration energy of the proton may be determined from the characteristic diagram illustrated in FIG. 16 in order to actually form a field stop layer using proton implantation such that the peak position of the field stop layer which a depletion layer reaches first has a distance X from the rear surface of a substrate and the above-mentioned range of γ is satisfied. FIG. 16 is the characteristic diagram illustrating the relationship between the range of the proton and the acceleration energy of the proton in the semiconductor device according to the invention.

The inventors' examination result proved that, when the logarithm log(Rp) of the range Rp of the proton (the peak position of the field stop layer) was x and the logarithm log(E) of the acceleration energy E of the proton was y, the range Rp of the proton and the acceleration energy E of the proton satisfied the relationship represented by the following Expression (2).

$$y = -0.0047x^4 + 0.0528x^3 - 0.2211x^2 + 0.9923x + 5.0474$$

FIG. 16 is the characteristic diagram illustrating the above-mentioned Expression (2) and illustrates the acceleration energy of the proton for obtaining the desired range Rp of the proton. In FIG. 16, the horizontal axis indicates the logarithm log(Rp) of the range Rp of the proton and a corresponding range Rp (μm) is described in parentheses below the axis value of log(Rp). In addition, the vertical axis indicates the logarithm log(E) of the acceleration energy E of the proton and the corresponding acceleration energy E of the proton is described in parentheses on the left side of the axis value of log(E). The above-mentioned Expression (2) is obtained by fitting the logarithm log(Rp) of the range Rp of the proton and the logarithm log(E) of the acceleration energy of the proton, which are obtained by, for example, experiments, to the quartic of x (=log(Rp)).

When the acceleration energy E of proton implantation is calculated (hereinafter, referred to as a calculated value E) from the desired average range Rp of the proton by the above-mentioned fitting expression and the proton is implemented into a silicon substrate with the calculated value E of the acceleration energy, the relationship between the actual acceleration energy E' and the average range Rp' (proton peak position) which is actually obtained by the spreading resistance analysis (SRA) method may be considered as follows.

When the actual acceleration energy E' is in the range of about E±10% with respect to the calculated value E of the acceleration energy, the actual average range Rp' is in the range of about ±10% of the desired average range Rp, which is in a measurement error range. Therefore, the influence of the deviation of the actual average range Rp' from the desired average range Rp on the electrical characteristics of the diode or the IGBT is small enough to be negligible. When the actual acceleration energy E' is in the range of ±10% of the calculated value E, the actual average range Rp' can be determined to be substantially equal to the set average range Rp. Alternatively, the actual average range Rp' may be in the range of ±10% of the average range Rp which is calculated by substituting the actual acceleration energy E' into the above-mentioned Expression (2).

In the actual accelerator, since both the acceleration energy E and the average range Rp are within the above-mentioned ranges (±10%), it is considered that the actual acceleration energy E' and the actual average range Rp' follow the fitting expression shown in the above-mentioned Expression (2) which is represented by the desired average range Rp and the calculated value E and no problem occurs. In addition, the range of a variation or an error may be in the range of ±10% of the average range Rp. It is preferable that the range of the variation or the error be in the range of ±5% of the average range Rp. In this case, it can be considered that the actual acceleration energy E' and the actual average range Rp' perfectly follow the above-mentioned Expression (2).

The use of the above-mentioned Expression (2) makes it possible to calculate the acceleration energy E of the proton required to obtain the desired range Rp of the proton. When the above-mentioned Expression (2) is used, the acceleration energy E of each proton for forming the field stop layer is substantially equal to a measured value obtained by actually measuring a sample, which is irradiated with protons with the acceleration energy E', using the spreading resistance analysis (SRA) method. Therefore, the use of the above-mentioned Expression (2) makes it possible to estimate the required acceleration energy E of the proton with high accuracy on the basis of the range Rp of the proton.

Tenth Embodiment

Figure 21:
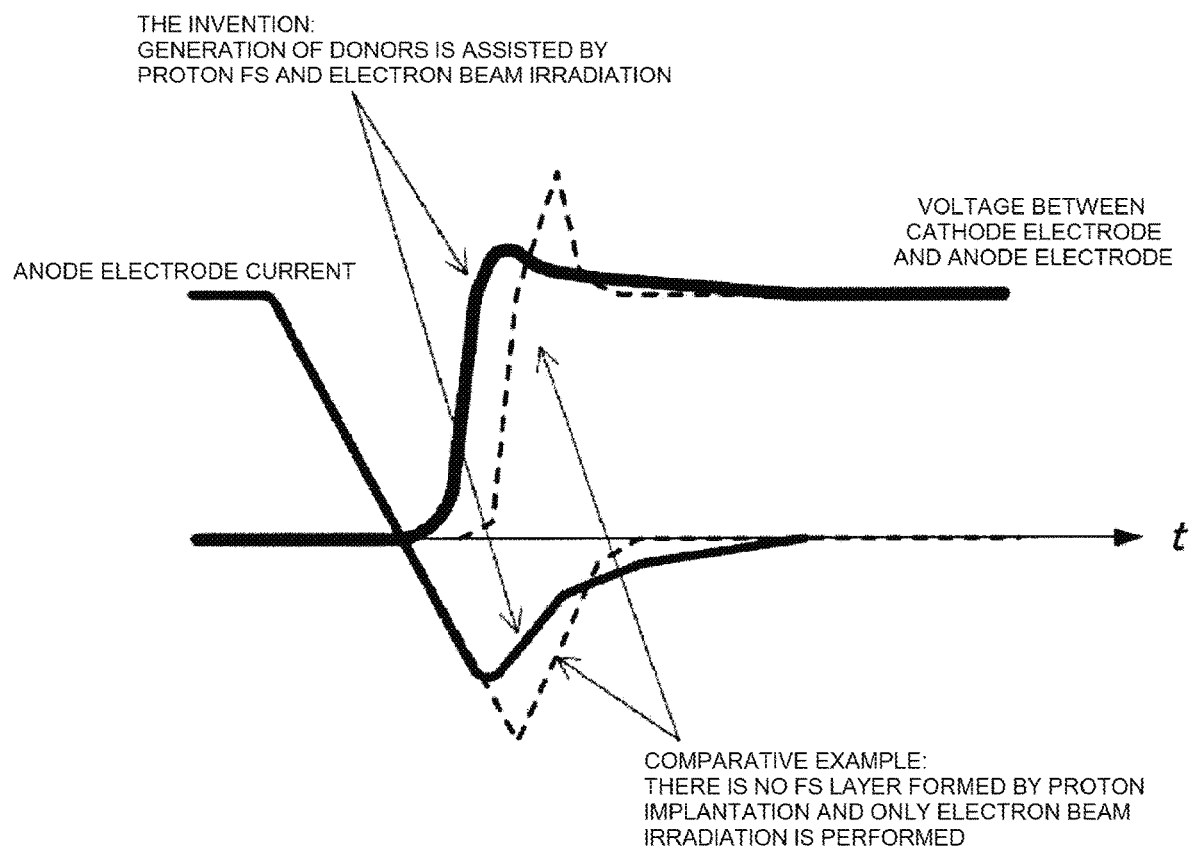
FIG. 21 is a characteristic diagram illustrating a reverse recovery waveform of the semiconductor device according to the invention.

Next, a reverse recovery waveform of the semiconductor device according to the invention will be described as a tenth embodiment. FIG. 21 is a characteristic diagram illustrating the reverse recovery waveform of the semiconductor device according to the invention. FIG. 21 illustrates a reverse recovery waveform of the invention (hereinafter, referred to as Example 1) which is produced according to the first embodiment and a reverse recovery waveform of a comparative example in which proton implantation is not performed and only electron beam irradiation is performed. A rated voltage is 1200 V and the doping concentration (average concentration) $N_d$ of an FZ silicon substrate and the finished thickness $W_0$ of the FZ silicon substrate after grinding are as illustrated in FIG. 17. The value of γ of a field stop layer which is disposed at the deepest position from the rear surface of the substrate is 1. In the invention, electron beam irradiation conditions were that a dose was 300 kGy and acceleration energy was 5 MeV. In the comparative example, a dose was 60 kGy. In the invention and the comparative example, a forward voltage drop was 1.8 V at any rated current density (in FIG. 17, a field corresponding to 1200 V). Test conditions were that a power supply voltage $V_{CC}$ was 800 V, an initial steady anode current was a rated current (current density×an active area: about 1 cm$^2$), and the floating inductance of a diode, a driving IGBT (1200 V), and an intermediate capacitor in a chopper circuit was 200 nH.

As can be seen from FIG. 21, in Example 1, a reverse recovery peak current is less than that in the comparative example and an overshoot voltage which is higher than the power supply voltage $V_{CC}$ is about 200 V lower than that in the comparative example. That is, the reverse recovery waveform according to the invention is a so-called soft recovery waveform. This indicates that it is possible to achieve a very soft waveform in lifetime control using electron beam irradiation which is fast, but is likely to cause hard recovery, which is the effect that has not been obtained in the related art (comparative example).

Figure 20:
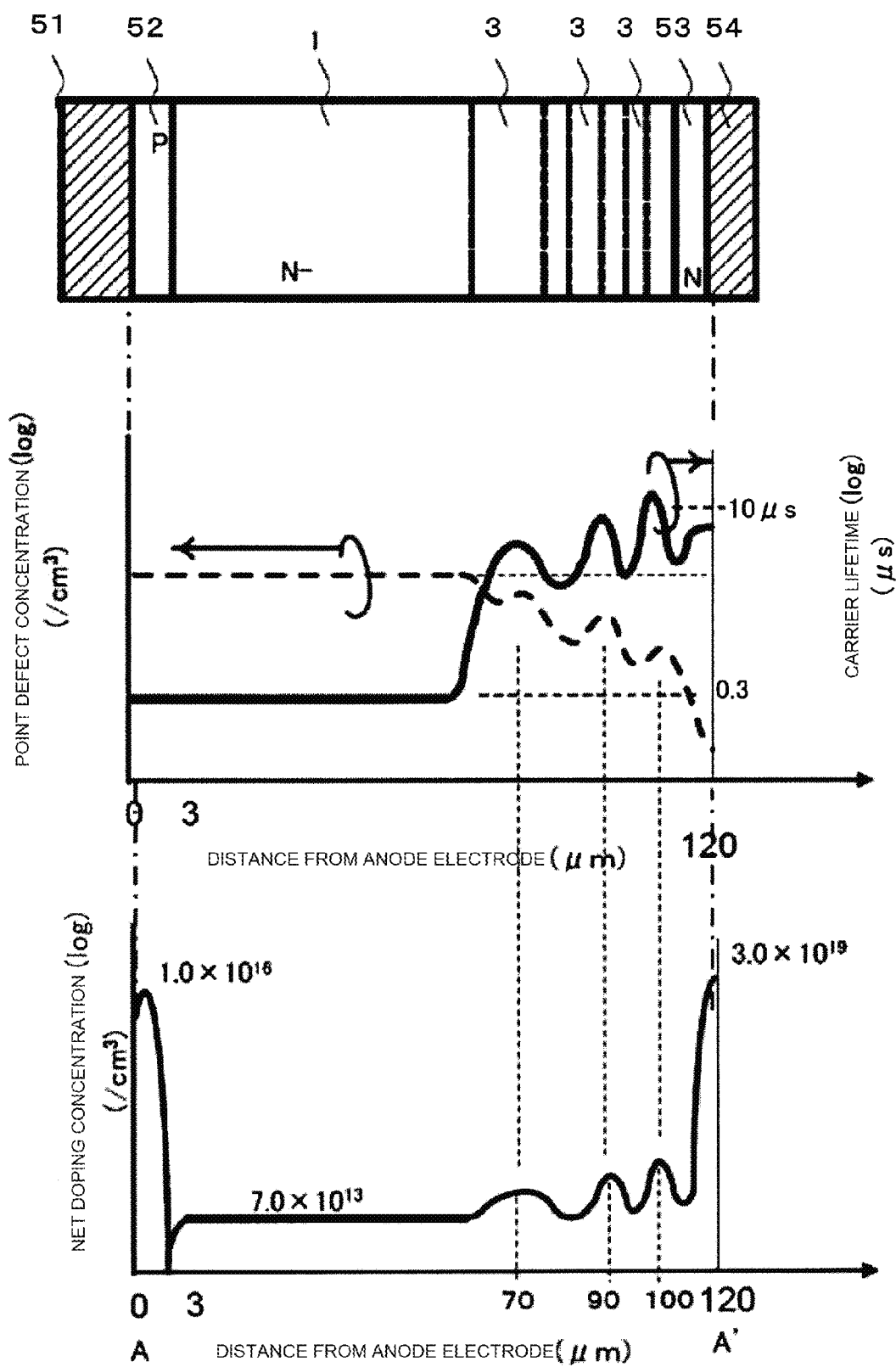
FIG. 20 is a characteristic diagram illustrating a carrier lifetime of the semiconductor device according to the invention.

The operation (reason) of the effect of the invention will be described with reference to FIG. 20. FIG. 20 is a characteristic diagram illustrating the carrier lifetime of the semiconductor device according to the invention. FIG. 20 illustrates the net doping concentration, point defect concentration, and carrier lifetime of the diode according to Example 1 in the depth direction from the anode electrode. It is guessed that the reason why the invention can achieve soft recovery is that, for a point defect (a vacancy (V) and a divacancy (VV)) which is introduced by electron beam irradiation, a dangling bond is terminated by a hydrogen atom which is introduced from the rear surface of the substrate by proton implantation. The defect which accelerates the generation and extinction of carriers is mainly a point defect and is energy center having the vacancy (V) and the divacancy (VV) as the main components. A dangling bond is formed in the point defect. When proton implantation is performed for the rear surface of the substrate and annealing (heat treatment) is performed, the defect is released and returns to a state close to a normal crystal state. In this case, peripheral hydrogen atoms terminate the dangling bond. In this way, the center having the vacancy (V) and the divacancy (VV) as main components disappears. In contrast, for a donor which is caused by a hydrogen atom (hydrogen induced donor), since a VOH defect composed of a vacancy (V), oxygen (O), and hydrogen (H) is the main defect, the dangling bond is terminated by the hydrogen atom by proton implantation and the VOH defect is also formed. That is, the point defect having the vacancy (V) and the divacancy (VV) as the main components is vanished by the formation of the VOH defect which most contributes to forming the donor. It is guessed that this accelerates the generation of the VOH donor while reducing the density of vacancies (V) and divacancies (VV) which causes a leakage current or carrier recombination.

In general, in the stage in which a silicon wafer is produced from an ingot and is sliced into wafers, the wafer includes oxygen. For example, an FZ wafer which is produced from pure polysilicon includes about 1×10$^{15}$/cm$^3$ to 1×10$^{16}$/cm$^3$ of oxygen. An FZ wafer which is drawn from polysilicon derived from a CZ wafer includes about 1×10$^{16}$/cm$^3$ to 1×10$^{17}$/cm$^3$ of oxygen. The oxygen included in the wafers contributes as O of the VOH defect.

In the related art, proton implantation which is used in order to reduce only the lifetime, without forming a large number of donors, has been known. It is guessed that the proton implantation leaves a large number of defects having the vacancy (V) and the divacancy (VV) as main components and forms few VOH defects. This is greatly different from the formation of the field stop layer by proton implantation from the rear surface of the substrate and hydrogen induced donors and a reduction in the defect having the vacancy (V) and the divacancy (VV) as main components which is obtained by the effect of terminating the dangling bond by electron beam irradiation with the hydrogen atom in the invention.

By this phenomenon, as illustrated in the middle of FIG. 20, for point defect density, a sufficient number of point defects caused by electron beam irradiation remain between the p-type anode layer and the field stop layer and a uniform lifetime distribution is formed. In this case, the lifetime is, for example, equal to or greater than about 0.1 µs and equal to or less than about 3 µs. Hydrogen concentration is increased by proton implantation in a portion that is about 50 µm from the rear surface of the substrate and is closer to the cathode than the position in the range from the field stop layer to the cathode on the rear surface of the substrate. Since the hydrogen atom terminates the dangling bond, the point defect concentration is reduced. Therefore, the lifetime of a depth region (a depth of 50 µm from the rear surface to the surface layer of the rear surface of the substrate) in which the field stop layer is formed is more than that of a region that is shallower than the deep region and is, for example, about 10 µs. This value is equal to or sufficiently close to a lifetime value (10 µs or more) when electron beam irradiation is not performed. Therefore, the concentration of minority carriers (not illustrated) (in this case, holes) has a distribution in which it is sufficiently low on the anode side and is sufficiently high on the cathode side. As a result, it is possible to achieve a very ideal carrier concentration distribution, depending on the soft recovery characteristics of the diode.

As described above, the point defect is introduced in the depth direction of the substrate by electron beam irradiation and the field stop layer including the hydrogen induced donors is formed by proton implantation from the rear surface of the substrate. Therefore, it is possible to reduce the number of point defects having the vacancy (V) and the divacancy (VV) as the main components in the region in which the field stop layer is formed and to obtain a lifetime distribution that is useful for soft recovery characteristics.

INDUSTRIAL APPLICABILITY

As described above, the method for producing the semiconductor device according to the invention is useful for, for example, a power semiconductor device that is used for industrial or automotive motor control or engine control.

EXPLANATIONS OF LETTERS OR NUMERALS

100 SEMICONDUCTOR DEVICE (DIODE)
101 n$^-$ SEMICONDUCTOR SUBSTRATE
101a n LAYER (FIELD STOP LAYER)
101b n$^+$ CATHODE LAYER (n$^+$ LAYER)
102 p-TYPE ANODE LAYER
104 TERMINATION REGION
105 ANODE ELECTRODE
106 CATHODE ELECTRODE
107 FIELD PLATE
108 INSULATING LAYER
200 SEMICONDUCTOR DEVICE (IGBT)

The invention claimed is:

1. A method for producing a semiconductor device, comprising:

implanting protons from a rear surface of a semiconductor substrate of a first conductivity type; and after the implanting protons, forming a first semiconductor region of the first conductivity type that has a impurity concentration higher than an impurity concentration of the semiconductor substrate by performing an annealing process for the semiconductor substrate in an annealing furnace, the forming a first semiconductor region including:

reducing a partial pressure of the oxygen in the annealing furnace by substituting oxygen gas for nitrogen gas in a normal pressure atmosphere; and after reducing a partial pressure of the oxygen in the annealing furnace, performing the annealing process in the annealing furnace with a hydrogen gas atmosphere in a range of 300° C. to 450° C., the hydrogen gas atmosphere including a volume concentration of hydrogen in a range of 6% to 30%, wherein when a logarithm log(E) of implantation energy E(eV) of a proton in the implanting protons is y and a logarithm log(Rp) of a range Rp(μm) of the proton is x, then $y=-0.0047x^4+0.0528x^3-0.2211x^2+0.9923x+5.0474$ is satisfied.

2. A method for producing a semiconductor device comprising:

implanting protons from a rear surface of a semiconductor substrate of a first conductivity type; and after the implanting protons, forming a first semiconductor region of the first conductivity type that has a impurity concentration higher than an impurity concentration of the semiconductor substrate by performing an annealing process for the semiconductor substrate in an annealing furnace, the forming a first semiconductor region including;

reducing a partial pressure of the oxygen in the annealing furnace by reducing an internal pressure of the annealing furnace, and introducing nitrogen gas and hydrogen gas into the annealing furnace until the internal pressure of the annealing furnace is a normal pressure, and after the reducing a partial pressure of the oxygen in the annealing furnace, performing the annealing process in the annealing furnace with a hydrogen gas atmosphere in a range of 300° C. to 450° C., the hydrogen gas atmosphere including a volume concentration of hydrogen in a range of 6% to 30%, wherein when a logarithm log(E) of implantation energy E(eV) of a proton in the implanting protons is y and a logarithm log(Rp) of a range Rp(μm) of the proton is x, then $y=-0.0047x^4+0.0528x^3-0.2211x^2+0.9923x+5.0474$ is satisfied.

3. The method for producing a semiconductor device according to claim 1, wherein the semiconductor device is a diode,
the first semiconductor region of the first conductivity type is an n-type field stop layer, and
the semiconductor substrate is a drift layer.

4. The method for producing a semiconductor device according to claim 1, wherein the semiconductor device is an insulated gate bipolar transistor,
the first semiconductor region of the first conductivity type is an n-type field stop layer, and
the semiconductor substrate is a drift layer.

5. The method for producing a semiconductor device according to claim 3, wherein the volume concentration of the hydrogen is set such that a donor generation rate increases, without any saturation, and a carrier concentration of a region from a drift layer of the semiconductor substrate to a cathode electrode increases.

6. The method for producing a semiconductor device according to claim 4, wherein the volume concentration of the hydrogen is set such that a donor generation rate increases, without any saturation, and a carrier concentration of a region from the drift layer of the semiconductor substrate to a collector electrode increases.

7. The method for producing a semiconductor device according to claim 1, wherein the annealing temperature of the annealing process is in a range of 330° C. to 380° C.

8. The method for producing a semiconductor device according to claim 1, wherein a processing time of the annealing process is in a range of 1 hour to 10 hours.

9. The method for producing a semiconductor device according to claim 8, wherein a processing timeof the annealing process is equal to or less than 5 hours.

10. The method for producing a semiconductor device according to claim 1, wherein the annealing furnace including a sealing member for preventing explosion due to hydrogen gas.

11. The method for producing a semiconductor device according to claim 1, wherein a proton dose in the implanting protons is in a range of $3\times10^{12}/cm^2$ to $5\times10^{14}/cm^2$.

12. The method for producing a semiconductor device according to claim 11, wherein the proton dose in the implanting protons is in a range of range of $3\times10^{12}/cm^2$ to $5\times10^{14}/cm^2$.

13. The method for producing a semiconductor device according to claim 1, wherein, the volume concentration of the hydrogen in the hydrogen gas atmosphere is in a range of 10% to 30%.

14. The method for producing a semiconductor device according to claim 1, further comprising:
grinding the rear surface of the semiconductor substrate.

15. The method for producing a semiconductor device according to claim 14, wherein the implanting protons includes implanting the protons from the ground surface of the semiconductor substrate.

16. The method for producing a semiconductor device according to claim 1, further comprising:
radiating an electron beam to the semiconductor substrate.

17. The method for producing a semiconductor device according to claim 16, further comprising:
performing a heat treatment for the semiconductor substrate after the radiating an electron beam.

18. The method for producing a semiconductor device according to claim 3, wherein a range of the protons from the rear surface is equal to or greater than 15 μm.

19. A method for producing a semiconductor device, comprising:

implanting protons from a rear surface of a semiconductor substrate of a first conductivity type; and after the implanting protons, forming a first semiconductor region of the first conductivity type that has a impurity concentration higher than an impurity concentration of the semiconductor substrate by performing an annealing process for the semiconductor substrate in an annealing furnace, the forming a first semiconductor region including:

reducing a partial pressure of the oxygen in the annealing furnace by substituting oxygen gas for nitrogen gas in a normal pressure atmosphere; and after reducing a partial pressure of the oxygen in the annealing furnace, performing the annealing process in the annealing furnace with a hydrogen gas atmosphere in a range of 300° C. to 450° C., the hydrogen gas atmosphere including a volume concentration of hydrogen in a range of 6% to 30%, wherein the semiconductor device is a diode, the first semiconductor region of the first conductivity type is an n-type field stop layer, the semiconductor substrate is a drift layer, and when q is an elementary charge, $N_d$ is an average concentration of the drift layer, $\varepsilon_s$ is a permittivity of the semiconductor substrate, $V_{rate}$ is a rated voltage, $J_F$ is rated current density, and $v_{sat}$ is a saturated speed at which a speed of carriers is saturated with predetermined electric field intensity, a distance index L is represented by the following Expression (1):

$$L = \sqrt{\frac{\varepsilon_S V_{rate}}{q\left(\dfrac{J_F}{qv_{sat}} + N_d\right)}}, \qquad \text{[Expression 1]}$$

and when the range of the protons from the rear surface is X and a thickness of the semiconductor substrate is $W_0$, $X = W_0 - \gamma L$ is established and $\gamma$ is equal to or greater than 0.2 and equal to or less than 1.5.

* * * * *